United States Patent
Moon et al.

(10) Patent No.: US 9,153,522 B2
(45) Date of Patent: Oct. 6, 2015

(54) SEMICONDUCTOR DEVICES AND METHODS OF FABRICATING THE SAME

(71) Applicants: Kwangjin Moon, Hwaseong-si (KR); SungHee Kang, Seongnam-si (KR); Taeseong Kim, Suwon-si (KR); Byung Lyul Park, Seoul (KR); Yeun-Sang Park, Yongin-si (KR); Sukchul Bang, Yongin-si (KR)

(72) Inventors: Kwangjin Moon, Hwaseong-si (KR); SungHee Kang, Seongnam-si (KR); Taeseong Kim, Suwon-si (KR); Byung Lyul Park, Seoul (KR); Yeun-Sang Park, Yongin-si (KR); Sukchul Bang, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/028,523

(22) Filed: Sep. 16, 2013

(65) Prior Publication Data

US 2014/0084473 A1 Mar. 27, 2014

(30) Foreign Application Priority Data

Sep. 25, 2012 (KR) .................... 10-2012-0106707

(51) Int. Cl.
*H01L 23/48* (2006.01)
*H01L 23/532* (2006.01)
(Continued)

(52) U.S. Cl.
CPC ........ *H01L 23/481* (2013.01); *H01L 21/76898* (2013.01); *H01L 23/53238* (2013.01); *H01L 25/0657* (2013.01); *H01L 23/3128* (2013.01); *H01L 23/49827* (2013.01); *H01L 24/05* (2013.01); *H01L 24/06* (2013.01); *H01L 24/13* (2013.01); *H01L 24/16* (2013.01); *H01L 2224/02372* (2013.01); *H01L 2224/0401* (2013.01); *H01L 2224/05* (2013.01); *H01L 2224/0557* (2013.01); *H01L 2224/05548* (2013.01); *H01L 2224/05567* (2013.01); *H01L 2224/05568* (2013.01); *H01L 2224/06181* (2013.01); *H01L 2224/131* (2013.01); *H01L 2224/13023* (2013.01); *H01L 2224/13024* (2013.01); *H01L 2224/16145* (2013.01); *H01L 2224/16225* (2013.01);
(Continued)

(58) Field of Classification Search
CPC ................ H01L 2924/00014; H01L 2924/00; H01L 21/76898; H01L 23/481; H01L 25/0657; H01L 2225/06541
See application file for complete search history.

(56) References Cited

U.S. PATENT DOCUMENTS 6,979,625 B1 * 12/2005 Woo et al. .................... 438/309
7,019,402 B2   3/2006 Andry et al.
(Continued)

FOREIGN PATENT DOCUMENTS

JP   2007005403 A   1/2007
JP   2007005404 A   1/2007
(Continued)

*Primary Examiner* — Jaehwan Oh
(74) *Attorney, Agent, or Firm* — Renaissance IP Law Group LLP

(57) ABSTRACT

Provided are semiconductor devices and methods of fabricating the same. The device may include a substrate including a first surface and a second surface opposing each other, a through-silicon-via (TSV) electrode provided in a via hole that may be formed to penetrate the substrate, and an integrated circuit provided adjacent to the through electrode on the first surface. The through electrode includes a metal layer filling a portion of the via hole and an alloy layer filling a remaining portion of the via hole. The alloy layer contains at least two metallic elements, one of which may be the same as that contained in the metal layer, and the other of which may be different from that contained in the metal layer.

28 Claims, 19 Drawing Sheets

(51) Int. Cl.
*H01L 25/065* (2006.01)
*H01L 21/768* (2006.01)
*H01L 23/31* (2006.01)
*H01L 23/00* (2006.01)
*H01L 23/498* (2006.01)

(52) U.S. Cl.
CPC ............... *H01L 2224/16237* (2013.01); *H01L 2225/06513* (2013.01); *H01L 2225/06517* (2013.01); *H01L 2225/06544* (2013.01); *H01L 2225/06565* (2013.01); *H01L 2924/00014* (2013.01); *H01L 2924/15311* (2013.01)

(56) References Cited

U.S. PATENT DOCUMENTS

| | | | |
|---|---|---|---|
| 7,157,372 B1 * | 1/2007 | Trezza | 438/675 |
| 7,528,006 B2 | 5/2009 | Arana et al. | |
| 7,678,696 B2 | 3/2010 | Andry et al. | |
| 7,994,048 B2 | 8/2011 | Komuro | |
| 8,026,592 B2 | 9/2011 | Yoon et al. | |
| 8,084,866 B2 | 12/2011 | Hiatt et al. | |
| 8,097,953 B2 | 1/2012 | Tseng et al. | |
| 8,193,093 B2 * | 6/2012 | Chauhan | 438/667 |
| 8,304,863 B2 | 11/2012 | Filippi et al. | |
| 8,390,120 B2 | 3/2013 | Moon et al. | |
| 8,610,283 B2 * | 12/2013 | Farooq et al. | 257/774 |
| 2005/0082676 A1 | 4/2005 | Andry et al. | |
| 2005/0127478 A1 | 6/2005 | Hiatt et al. | |
| 2007/0001266 A1 | 1/2007 | Arana et al. | |
| 2007/0045780 A1 * | 3/2007 | Akram et al. | 257/621 |
| 2007/0243706 A1 | 10/2007 | Komuro | |
| 2010/0035430 A1 | 2/2010 | Andry et al. | |
| 2010/0038800 A1 | 2/2010 | Yoon et al. | |
| 2010/0102453 A1 | 4/2010 | Tseng et al. | |
| 2011/0097853 A1 | 4/2011 | Kim et al. | |
| 2011/0108988 A1 | 5/2011 | Lim et al. | |
| 2011/0177655 A1 | 7/2011 | Chiou et al. | |
| 2011/0193199 A1 * | 8/2011 | Filippi et al. | 257/621 |
| 2011/0316168 A1 | 12/2011 | Moon et al. | |
| 2013/0062587 A1 * | 3/2013 | Lee et al. | 257/4 |
| 2013/0118784 A1 * | 5/2013 | Uzoh et al. | 174/257 |

FOREIGN PATENT DOCUMENTS

| | | |
|---|---|---|
| JP | 2008135482 A | 6/2008 |
| JP | 4552770 B2 | 9/2010 |

* cited by examiner

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0106707, filed on Sep. 25, 2012, in the Korean Intellectual Property Office, the entire contents of which are hereby incorporated by reference.

BACKGROUND

Example embodiments of the inventive concept relate to a semiconductor device, and in particular, to semiconductor devices with through electrodes such as through-silicon-via (TSV) electrodes and methods of fabricating the same.

In the electronics industry, there has been an increasing demand for low cost electronic devices with the development of lighter, smaller, faster, more multi-functional, and/or higher performance electronic systems. To meet such demands, multi-chip stacked package techniques and/or systems have been introduced.

In a multi-chip stacked package or system-in-package, multiple semiconductor devices having various functions may be assembled in a single semiconductor package. A multi-chip stacked package or system in package may have a size similar to a single chip package in terms of a planar surface area or 'footprint.' Thus, a multi-chip stacked package or system in package may be used in small and/or mobile devices with high performance requirements, such as, mobile phones, notebook computers, memory cards, and/or portable camcorders. Multi-chip stacked package techniques or system-in-package techniques may be realized using through-silicon-via (TSV) electrodes. However, the use of TSV electrodes may be associated with problems, which may affect performance of the devices in which they are used.

SUMMARY

Example embodiments of the inventive concept provide a semiconductor package with through electrodes. The through electrodes may be configured to reduce an extrusion of crystal grains therein, which may be caused by a thermal stress. This enables to suppress the semiconductor package from being deteriorated by contact failures and/or crack failures.

According to example embodiments of the inventive concepts, a semiconductor device may include a substrate including a first surface and a second surface opposite to each other; and a through electrode provided in a via hole penetrating the substrate. The through electrode includes a metal layer filling a portion of the via hole and an alloy layer filling another portion of the via hole. The alloy layer contains at least two metallic elements, one of which may be the same as that contained in the metal layer, and the other one of which may be different from that contained in the metal layer.

In example embodiments, the through electrode may include a top surface adjacent to the first surface and a bottom surface adjacent to the second surface, and the alloy layer may provide at least a portion of the top surface of the through electrode.

In example embodiments, the metal layer may include an extended portion interposed between sidewall of the alloy layer and a sidewall of the via hole.

In example embodiments, a top diameter of the alloy layer may be greater than a horizontal thickness of the extended portion.

In example embodiments, the device may further include an upper interconnection line connecting the through electrode electrically to the integrated circuit. Both the metal layer and the alloy layer may be in contact with the upper interconnection line.

In example embodiments, the through electrode may further include a barrier layer provided along a sidewall of the via hole, and the alloy layer may be in contact with the barrier layer.

In example embodiments, the through electrode may further include a conductive separation layer between the metal layer and the alloy layer, and the metal layer may be separated from the alloy layer by the conductive separation layer.

In example embodiments, a thickness of the alloy layer ranges between about 2-15% of a total vertical length of the through electrode.

In example embodiments, a crystal grain size of the alloy layer may be smaller than that of the metal layer.

In example embodiments, a mean crystal grain size of the metal layer may be at least greater than two times of a mean crystal grain size of the alloy layer.

In example embodiments, the alloy layer may include a copper alloy or a tungsten alloy.

In example embodiments, the metal layer may include copper (Cu), and the alloy layer may include at least one of Cu—Mn alloy containing Mn of 5-8 at. %, Cu—Au alloy containing Au of 10 at. % or more, or Cu—Ni alloy containing Ni of 2 at. % or more.

In example embodiments, the metal layer may include tungsten (W), and the alloy layer may include at least one of W—Mn alloy containing Mn of 5-8 at. %, W—Au alloy containing Au of 10 at. % or more, or W—Ni alloy containing Ni of 2 at. % or more.

In example embodiments, the device may further include a first interlayer insulating layer covering the integrated circuit. The through electrode extends to a top surface of the first interlayer insulating layer.

In example embodiments, the alloy layer has a bottom surface that may be higher than the first surface.

In example embodiments, the device may further include a first interlayer insulating layer covering the integrated circuit. The first interlayer insulating layer covers a top surface of the through electrode.

In example embodiments, the device may further include a first interlayer insulating layer covering the integrated circuit, a conductive wire on the first interlayer insulating layer, and a second interlayer insulating layer on the conductive wire. The through electrode extends to about a top surface of the second interlayer insulating layer opposing the first interlayer insulating layer.

According to example embodiments of the inventive concepts, a semiconductor device may include a substrate including an active surface and a non-active surface arranged opposite to each other and a via hole extending from the active surface to the non-active surface through the substrate, and a through electrode provided in the via hole. The through electrode may include a metal layer filling a portion of the via hole and an alloy layer provided on the metal layer, the alloy layer containing at least one metallic element that may be different from that contained in the metal layer, and the metal layer may include an extended portion interposed between sidewall of the alloy layer and a sidewall of the via hole.

In example embodiments, the metal layer may further include a body portion provided below the alloy layer, and a crystal grain size of the extended portion may be smaller than that of the body portion.

In example embodiments, the device may further include an integrated circuit provided adjacent to the through electrode on an active surface of the substrate, and an upper interconnection line connecting the through electrode electrically to the integrated circuit. Both the metal layer and the alloy layer may be in contact with the upper interconnection line.

In example embodiments, the device may further include an interlayer insulating layer covering the integrated circuit. The through electrode may be connected to the upper interconnection line through the interlayer insulating layer.

In example embodiments, the alloy layer has a bottom surface that may be higher than the active surface.

In example embodiments, the extended portion has an inner sidewall slanted at an angle with respect to the sidewall of the via hole.

In example embodiments, the alloy layer may further include a metallic element that may be the same as that in the metal layer.

According to example embodiments of the inventive concepts, a method of fabricating a semiconductor device may include forming a via hole through a first surface of a substrate to penetrate at least a portion of the substrate, forming a metal layer in the via hole, forming an alloy layer on the metal layer to substantially fill the via hole and contain at least one metallic element that may be different from that in the metal layer. The method may additionally include polishing a second surface of the substrate opposite the first surface of the substrate to expose the metal layer.

In example embodiments, forming of the metal layer may include sequentially forming a barrier layer and a seed layer on a sidewall of the via hole.

In example embodiments, the metal layer may be formed to have a thickness smaller on a sidewall of the via hole near a top surface of the via hole than near a bottom surface of the via hole.

In example embodiments, the metal layer may be formed by an electroplating process using the seed layer, and forming of the metal layer may further include interrupting an electric current applied to the seed layer to dissolve a portion of the metal layer that may be formed on a sidewall of the via hole.

In example embodiments, the dissolving of the metal layer may be performed to expose a portion of the seed layer, and the alloy layer may be formed by an electroplating process using the exposed seed layer.

In example embodiments, the dissolving of the metal layer may be performed to dissolve a portion of the seed layer and expose the barrier layer.

In example embodiments, the alloy layer may be formed using a method different from that for forming the metal layer, and the method may further include forming a conductive separation layer on a surface of the metal layer, before forming of the alloy layer.

In example embodiments, the method may further include forming an integrated circuit on a first surface of the substrate, forming a first interlayer insulating layer to cover the integrated circuit, forming a conductive wire on the first interlayer insulating layer. The forming of the metal layer and the alloy layer may be performed after forming the integrated circuit and the first interlayer insulating layer and before forming the conductive wire.

In example embodiments, the method may further include forming an integrated circuit on a first surface of the substrate. The forming of the metal layer and the alloy layer may be performed before forming the integrated circuit.

In example embodiments, the method may further include forming an integrated circuit on a first surface of the substrate, forming a first interlayer insulating layer to cover the integrated circuit, forming a conductive wire on the first interlayer insulating layer, and forming a second interlayer insulating layer on the conductive wire. The forming of the metal layer and the alloy layer may be performed after forming the second interlayer insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
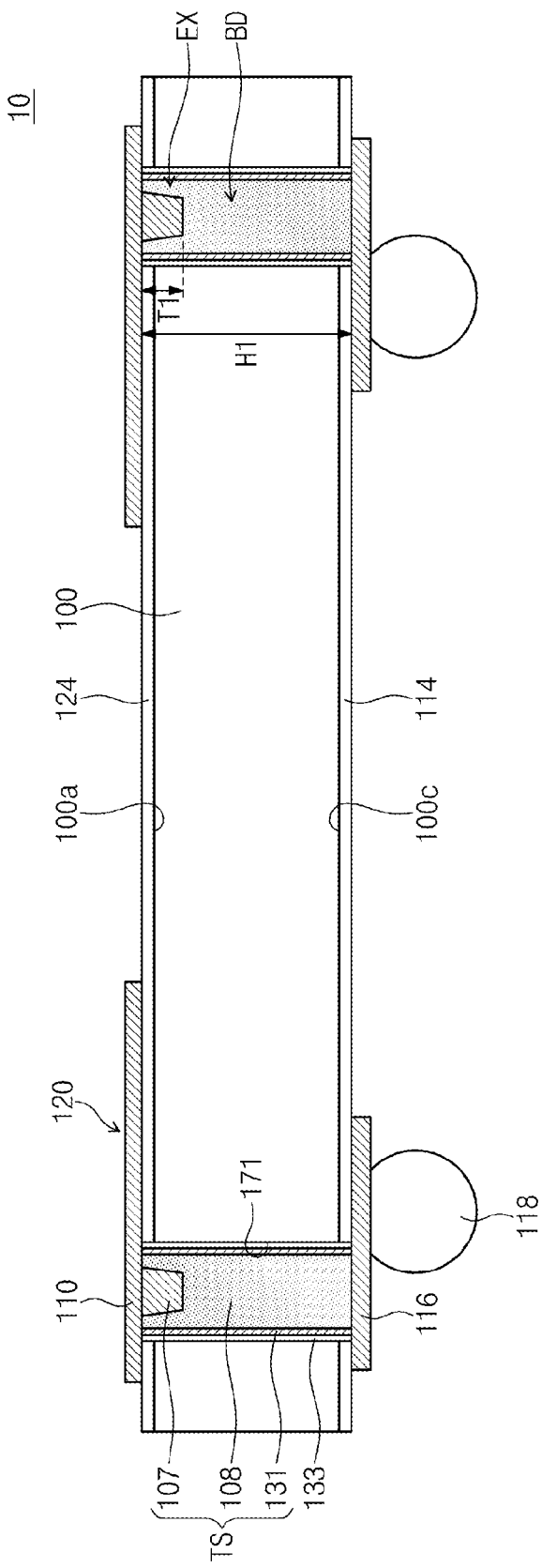
FIG. 1 is a cross-sectional view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Semiconductor Device]

FIG. 1 is a cross-sectional view illustrating a semiconductor device 10 according to example embodiments of the inventive concept.

Referring to FIG. 1, a semiconductor device 10 may include a conductive connecting portion 120 used as a pathway of electrical signals through a substrate 100. The conductive connecting portion 120 may include a through electrode TS formed to penetrate the substrate 100. The through electrode TS may be a through-silicon-via (TSV) electrode. The conductive connecting portion 120 may include at least one of an upper interconnection line 110, which may be provided on a top surface 100a of the substrate 100 to be in contact with the through electrode TS, or a lower wire 116, which may be provided on a bottom surface 100c of the substrate 100 to be in contact with the through electrode TS. The top surface 100a may be referred to as an "active surface" of the substrate 100, while the bottom surface 100c may be referred to as a "non-active surface" of the substrate 100. Each of the top and bottom surfaces 100a and 100c may be substantially flat planar surfaces that are substantially perpendicular to a thickness direction of the substrate 100.

The upper interconnection line 110 may horizontally extend parallel to the top surface 100a of the substrate 100, and the lower wire 116 may horizontally extend parallel to the bottom surface 100c of the substrate 100. At least one of the upper interconnection line 110 and the lower wire 116 may form a redistribution layer/structure. A first bump 118 may be attached to the lower wire 116 to connect the semiconductor device 10 electrically to other substrates or devices (e.g., other semiconductor device or a printed circuit board) or to serve as a connection element. A connection element may be further attached to the upper interconnection line 110.

The through electrode TS may penetrate the substrate 100 vertically to connect the upper interconnection line 110 to the lower wire 116. Accordingly, electric signals transmitted through the upper interconnection line 110 may be transmitted to the lower wire 116 via the through electrode TS or through the substrate 100, or vice versa.

The top surface 100a and the bottom surface 100c of the substrate 100 may be covered with an upper protection layer 124 and a lower protection layer 114, respectively. The upper protection layer 124 and the lower protection layer 114 may protect and electrically isolate the substrate 100 from an external environment. The conductive connecting portion 120 may be electrically separated from the substrate 100. For example, the upper protection layer 124 may be configured to separate and electrically isolate the upper interconnection line 110 from the top surface 100a of the substrate 100, and the lower protection layer 114 may be configured to separate and electrically isolate the lower wire 116 from the bottom surface 100c of the substrate 100. For example, the upper protection layer 124 and the lower protection layer 114 may include at least one layer of silicon oxide, silicon nitride, or silicon oxynitride. The through electrode TS may be provided in a via hole 171 penetrating the substrate 100. The via hole 171 may be defined by an inner surface of the substrate 100. The through electrode TS may be separated and electrically isolated from the substrate 100 by an insulating liner layer 133. The via hole 171 may have a side surface substantially perpendicular to the top surface 100a and the bottom surface 100c. The insulating liner layer 133 may include an oxide layer or a nitride layer. The insulating liner layer 133 may be formed to surround the through electrode TS and extend from the upper interconnection line 110 to the lower wire 116 along a sidewall of the through electrode TS.

The through electrode TS may include a metal layer 108, which may be formed to fill a portion of the via hole 171, and an alloy layer 107, which may be provided on the metal layer 108 in the via hole 171. The alloy layer 107 may be exposed through a top surface of the through electrode TS adjacent to the top surface 100a of the substrate 100 and be connected to the upper interconnection line 110. The alloy layer 107 may not be exposed through a bottom surface of the through electrode TS adjacent to the bottom surface 100c of the substrate 100. For example, a thickness T1 of the alloy layer 107 may range about 2-15% of a total height of the through electrode TS, when the thickness T1 is measured along a vertical direction perpendicular to the top surface 100a of the alloy layer 107. The through electrode TS may include a barrier layer 131 provided between the insulating liner layer 133 and the metal layer 108. The barrier layer 131 may enable to suppress metal atoms from being diffused from the metal layer 108 to the substrate 100. The barrier layer 131 may include at least one of a titanium layer, a titanium nitride layer, a tantalum layer, a tantalum nitride layer, a ruthenium layer, a cobalt layer, a manganese layer, a tungsten nitride layer, a nickel layer, a nickel boride layer or a double layer of titanium and titanium nitride.

The metal layer 108 may include at least one layer made of copper, tungsten, silver, gold, or indium. The alloy layer 107 may include a metallic material, whose metallic elements are different from metallic elements in the metal layer 108. For example, the alloy layer 107 may include a metal alloy containing at least two metallic elements, one of which is the same as that contained in the metal layer 108, and the other one of which is different from that contained in the metal layer 108. For example, if the metal layer 108 is a copper layer, the alloy layer 107 may be formed of an alloy containing at least one metallic element (e.g., W, Mn, Cr, Ag, Au, Ni, or SgAG) other than copper. The alloy layer 107 may be formed of an alloy containing two, three or more metallic elements. In addition, the alloy layer 107 may further contain at least one non-metallic element provided as an impurity. In example embodiments, the alloy material containing metallic elements, other than the copper, may be Cu—Mn alloy containing Mn of 5-8 at. %, Cu—Au alloy containing Au of 10 at. % or more, or Cu—Ni alloy containing Ni of 2 at. % or more. For example, if the metal layer 108 is a tungsten layer, the alloy layer 107 may be formed of an alloy containing at least one metallic element, other than tungsten. For example, the alloy material containing metallic elements other than the tungsten may be W—Mn alloy containing Mn of 5-8 at. %, W—Au alloy containing Au or 10 at. % or more, or W—Ni alloy containing Ni of 2 at. % or more.

In example embodiments, the metal layer 108 may be formed of a non-alloy material. In the present specification, the term "alloy" means a compound made of at least two metallic elements, but does not include a compound made of one metallic element and one or more non-metallic elements. The alloy may, however, include a non-metallic element in addition to the two or more metallic elements.

If desired, the alloy layer 107 may include only metallic elements that are different from the metallic element constituting the metal layer 108. For example, if the metal layer 108 is formed of copper, the alloy layer 107 may be formed of a copper-free alloy material. The copper-free alloy material may be, for example, at least one of Ag—Ni alloy, Ag—Mn alloy, Ag—Au alloy, W—Ni alloy, W—Mn alloy, W—Au alloy, W—Ti alloy, or W—Ta alloy.

The presence of the alloy layer 107 may help substantially reduce the growth of crystal grains of the metal layer 108 in a subsequent thermal process. For example, the thermal process may include a process of forming a conductive wire, which may be performed after the formation of the through electrode TS. In addition, the thermal process may be a process performed at a temperature of about 400° C. or more. In such a thermal process, a grain boundary migration may occur, such that large crystal grains of the metal layer 108 may continue to grow but small crystal grains of the metal layer 108 may vanish. As a result, crystal grains of the top surface of the through electrode TS adjacent to the top surface 100a of the substrate 100 may protrude locally as a result of thermal stress. The protrusion may result in disconnection or contact resistance failure between the through electrode TS and a conductive wire (e.g., the upper interconnection line 110) thereon, or may result in cracking of an insulating layer provided on the through electrode TS.

By contrast, if the alloy layer 107 is provided on the metal layer 108, it is possible to suppress the growth of the crystal grains of the through electrode TS at the region where the through electrode TS is in contact with the upper interconnection line 110. For example, as shown in FIG. 1, if the metal layer 108 includes a body portion BD provided below the alloy layer 107 and an extended portion EX provided between the alloy layer 107 and the bather layer 131, the growth of crystal grain may be slower at the extended portion EX than at the body portion BD. This means that, after the thermal process, the crystal grain size may be smaller at the extended portion EX than at the body portion BD.

The growth of crystal grains in the alloy layer 107 may be suppressed due to the presence of heterogeneous metallic elements contained in the alloy layer 107. For example, a mean crystal grain size of the alloy layer 107 may be less than half that of the body portion BD. In certain embodiments, the mean crystal grain size of the body portion BD may range from about 3 µm to about 4 µm, while the mean crystal grain size of the alloy layer 107 may range from about 1 µm to about 2 µm.

As described above, due to the presence of the alloy layer 107, it is possible to suppress growth, and therefore protrusion of the metal layer 108, and consequently, to improve contact resistance characteristics between the through electrode TS and the upper interconnection line 110.

In the semiconductor device 10, shapes and structures of the metal layer 108 and the alloy layer 107 may be varied, as will be described with reference to the following embodiments. Similarly, shapes of the insulating liner layer 133, the barrier layer 131, and the via hole 171 may also be modified.

[Fabrication Method]

Figure 5:
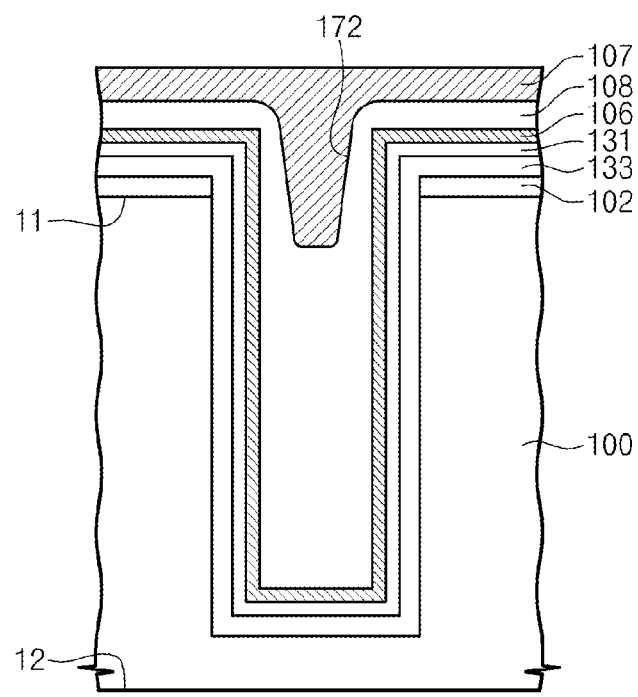
Figure 6:
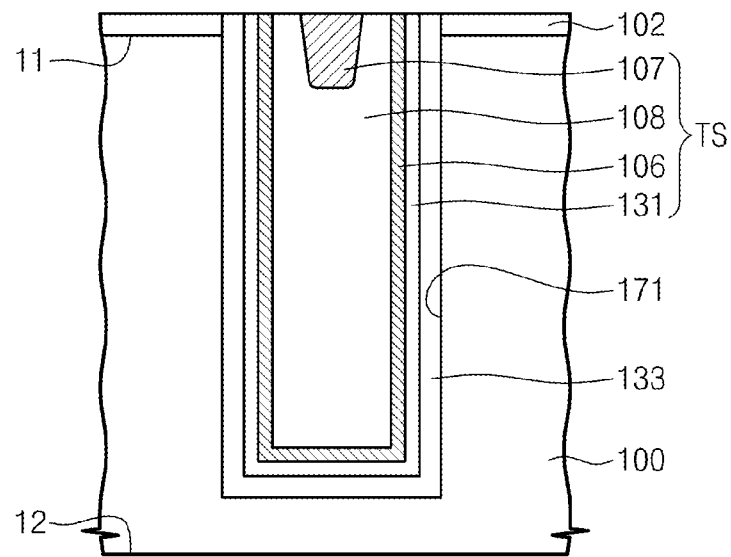
Figure 7A:
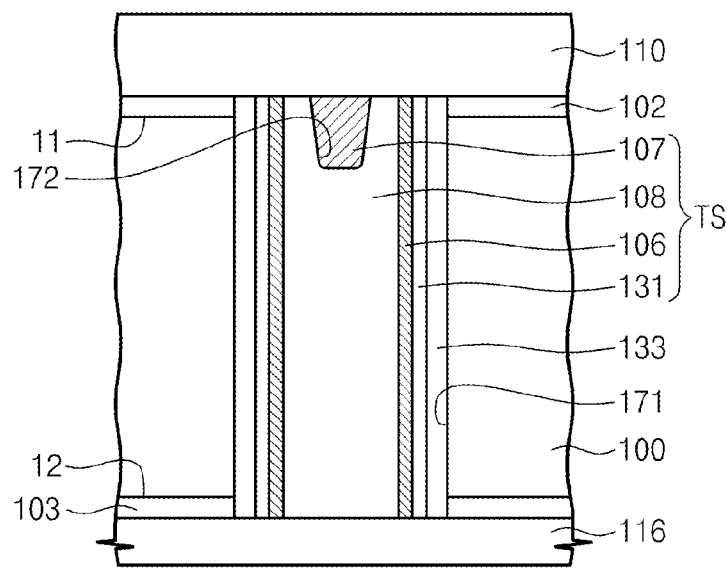
Figure 7B:
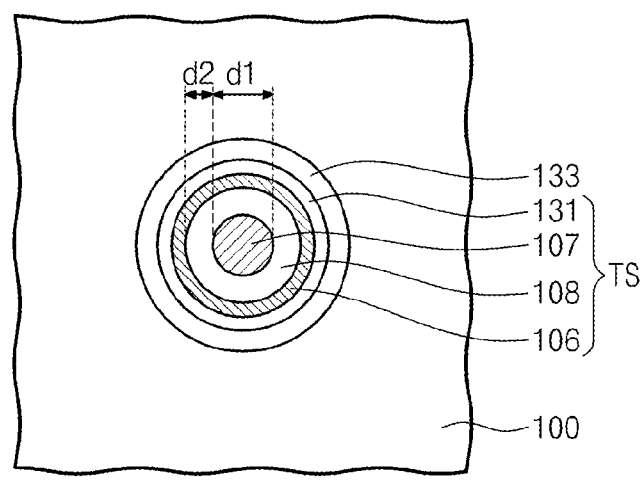

FIGS. 2 through 6 and 7A are cross-sectional views illustrating a method of fabricating a semiconductor device according to example embodiments of the inventive concept, and FIG. 7B is a plan view illustrating a method of fabricating the semiconductor device of FIG. 7A.

Figure 2:
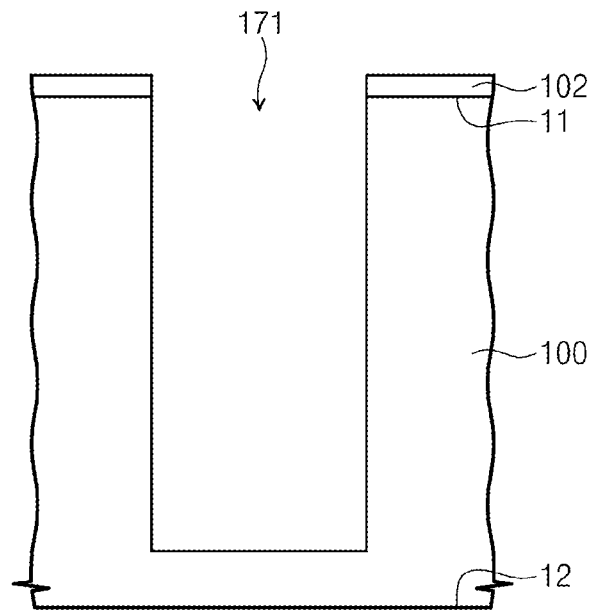
FIGS. 2 through 6 and 7A and FIG. 7B are cross-sectional views and a plan view illustrating a method of fabricating a semiconductor device according to example embodiments of the inventive concept.

Referring to FIG. 2, a substrate 100 may be provided. The substrate 100 may include a silicon layer or a silicon-containing semiconductor layer. Alternatively, the substrate 100 may include other semiconductor materials such as GaAs. An upper insulating layer 102 may be formed on a first surface 11 of the substrate 100. For example, the upper insulating layer 102 may include silicon oxide, silicon nitride, or silicon oxynitride. A via hole 171 may be formed through the upper insulating layer 102 to extend toward a second surface 12 of the substrate 100. Hereinafter, the first and second surfaces 11 and 12 may be referred to as an active surface and a non-active surface of the substrate 100, respectively. The active surface of the substrate 100 may mean a surface where semiconductor devices such as a transistor are formed thereon. In plan view, the via hole 171 may be shaped like circle, ellipse, square or rectangle. The via hole 171 may be formed using a drilling process, a Bosch etching process, or a steady-state etching process. A depth of the via hole 171 may not penetrate the entire substrate 100. In other words, the depth of the via hole 171 may be less than the overall thickness of the substrate 100, such that the via hole 171 does not fully penetrate the substrate 100. For example, the via hole 171 may be formed to a depth of about 50 µm or less, but the depth of the via hole 171 may be modified depending on a design rule or a desired property of the device.

Figure 3:
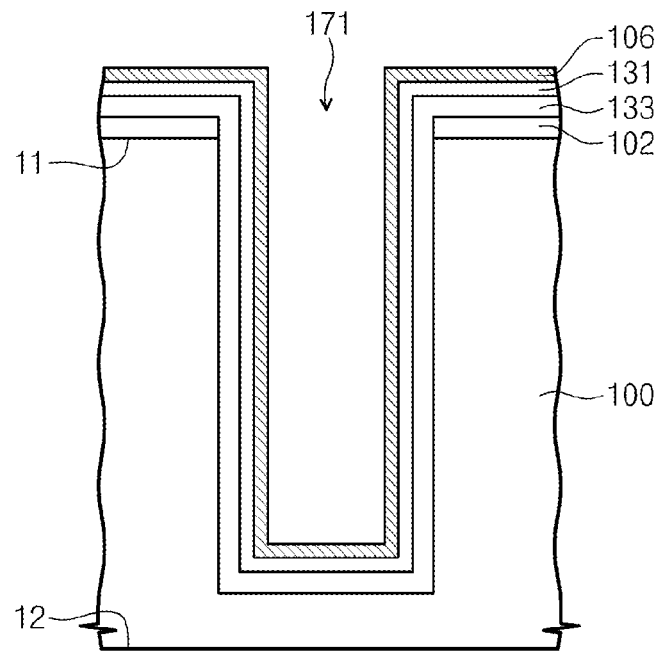

Referring to FIG. 3, an insulating liner layer 133 may be formed in the via hole 171. The insulating liner layer 133 may be formed by depositing an insulating material, such as oxide (e.g., SiOx) or nitride (e.g., SiNx). The insulating liner layer 133 may be deposited on an inner sidewall of the via hole 171. The insulating liner layer 133 may extend on the upper insulating layer 102. For example, the insulating liner layer 133 may be formed by a thin film formation process such as a chemical vapor deposition (CVD) process.

A barrier layer 131 may be formed on the insulating liner layer 133. The barrier layer 131 may include at least one of a titanium layer, a titanium nitride layer, a tantalum layer, a tantalum nitride layer, a ruthenium layer, a cobalt layer, a manganese layer, a tungsten nitride layer, a nickel layer, a nickel boride layer or a double layer of titanium and titanium nitride. For example, the barrier layer 131 may be formed by a sputtering process, a CVD process or an atomic layer deposition process.

A seed layer 106 may be formed on the barrier layer 131. The seed layer 106 may be provided to deposit a metal layer to be described below, and for example, include the same material as the metal layer. The seed layer 106 may include copper, tungsten, silver, gold, or indium. For example, the seed layer 106 may be formed by a sputtering process.

Figure 4:
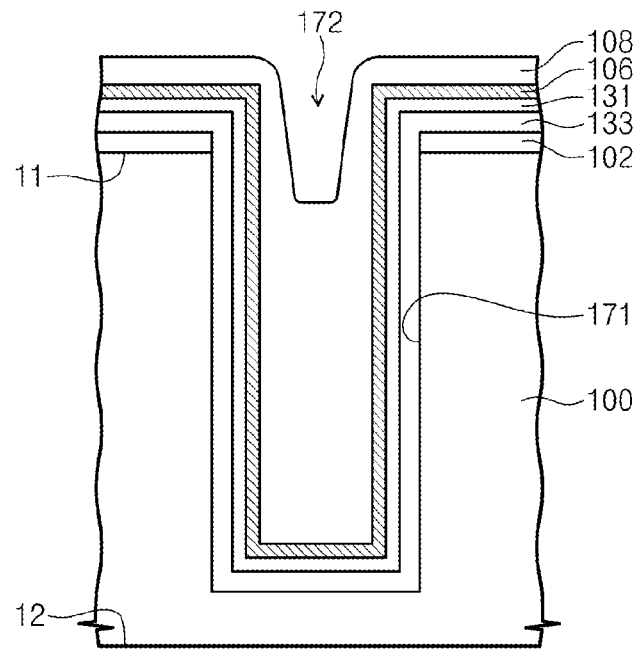

Referring to FIG. 4, a conductive layer such as a metal layer 108 may be formed on the seed layer 106. For example, the metal layer 108 may be formed of at least one layer of copper, tungsten, silver, gold, or indium. The metal layer 108 may be formed by an electroplating process using the seed layer 106. In other example embodiments, the metal layer 108 may be formed by an electro-less plating process or a sputtering process. The metal layer 108 may extend on the upper insulating layer 102 along the seed layer 106. For example, the electroplating process may include dipping the wafer into electroplating solution containing $CuSO_4$, $H_2SO_4$, and Cl. The metal layer 108 may be formed not to fill the whole space of the via hole 171, and thus, the metal layer 108 may be formed to have an inner sidewall defining a hole region 172 at an upper region of the via hole 171. For example, the metal layer 108 may be formed to be thinner on a sidewall of the via hole 171 than on a bottom surface of the via hole 171. This difference in thickness of the metal layer 108 may be achieved by controlling the suppressor and accelerator to be used for the electroplating process or a current density distribution. For example, the electroplating process may be performed using poly ethylene glycol (PEG) as the suppressor and sulfopropyl disulfide (SPS) or Bis-(3-sulfopropyl)disulfide as the accelerator. The suppressor may be a material to suppress the metal layer 108 from being formed on the sidewall of the via hole 171.

Referring to FIG. 5, an alloy layer 107 may be formed to fill the hole region 172. For example, the alloy layer 107 may be formed using an electroplating process, in which the alloy layer 107 is used as a pathway of electric current. In other example embodiments, the alloy layer 107 may be formed by an electroless plating process or a sputtering process. The alloy layer 107 may extend on the upper insulating layer 102 along the metal layer 108. The alloy layer 107 may be formed of a metallic material, whose metallic elements are different from metallic elements in the metal layer 108. For example, the alloy layer 107 may be formed of a metal alloy containing at least two metallic elements, one of which is the same as that contained in the metal layer 108, and the other ones of which are different from that contained in the metal layer 108. For example, if the metal layer 108 is a copper layer, the alloy layer 107 may be formed of an alloy containing at least one metallic element (e.g., W, Mn, Cr, Ag, Au, Ni, or SgAG) other than copper. The alloy layer 107 may be formed of an alloy containing two, three or more metallic elements. In addition, the alloy layer 107 may further contain at least one non-metallic element provided as an impurity. In example embodiments, the alloy material containing metallic elements, other than the copper, may be Cu—Mn alloy containing Mn of 5-8 at. %, Cu—Au alloy containing Au of 10 at. % or more, or Cu—Ni alloy containing Ni of 2 at. % or more. For example, if the metal layer 108 is a tungsten layer, the alloy layer 107 may be formed of an alloy containing at least one metallic element other than tungsten. For example, the alloy material containing metallic elements other than the tungsten may be W—Mn alloy containing Mn of 5-8 at. %, W—Au alloy containing Au or 10 at. % or more, or W—Ni alloy containing Ni of 2 at. % or more. The formation of the alloy layer 107 may include adding a source material of the metallic element constituting the alloy layer 107 into the electroplating solution. After the formation of the alloy layer 107, an annealing process may be performed at a temperature of, for example, about 200-500° C. As a result of the annealing process, crystal grains in the metal layer 108 may be partially grown to relieve residual stress in the metal layer 108 and the alloy layer 107.

The alloy layer 107 may be formed of an alloy material containing metallic elements different from the metallic element in the metal layer 108. For example, if the metal layer 108 is a copper layer, the alloy layer 107 may be formed of a copper-free alloy material. In example embodiments, the copper-free alloy material may be at least one of Ag—Ni alloy, Ag—Mn alloy, Ag—Au alloy, W—Ni alloy, W—Mn alloy, W—Au alloy, W—Ti alloy, or W—Ta alloy.

Referring to FIG. 6, a planarization process may be performed on the resulting structure to expose the upper insulating layer 102. For example, the planarization process may be performed using a chemical mechanical polishing (CMP) process. As the result of the planarization process, a through electrode TS may be locally formed in the via hole 171.

Referring to FIGS. 7A and 7B, the second surface 12 of the substrate 100 may be polished to expose the through electrode TS. FIG. 7B is a plan view illustrating a top surface of the through electrode TS of FIG. 7A. The polishing process will be described in detail below.

Firstly, a carrier substrate (not shown) may be attached to the first surface 11 of the substrate 100 using an adhesion layer. Due to the presence of the carrier substrate, it is possible to relieve a mechanical stress, which may be applied to the substrate 100 in the process of polishing the second surface 12 of the substrate 100, and to prevent the thin substrate 100 from being deformed after the polishing process. The carrier substrate may include a glass substrate, or a resin substrate. The adhesion layer may include ultraviolet adhesives or thermoplastic adhesives. Thereafter, the second surface 12 of the substrate 100 may be polished to expose the insulating liner layer 133. The polishing of the substrate 100 may be performed by, for example, a grinding process, in which at least one of CMP, etch-back, spin etch steps is used.

Next, the substrate 100 may be selectively etched to form the through electrode TS protruding from the second surface 12 of the substrate 100. The selective etching step may be performed using a wet etching process or a dry etching process having an etch rate higher than the insulating liner layer 133. For example, if the insulating liner layer 133 is a silicon oxide layer, an etching gas containing $SF_6$ may be used to etch selectively the substrate 100. A lower insulating layer 103 may be formed on the second surface 12 to cover the through electrode TS, and then, the lower insulating layer 103 may be partially removed to expose the through electrode TS. The lower insulating layer 103 may include a silicon oxide layer, a silicon nitride layer, or a silicon oxynitride layer.

An upper interconnection line 110 may be formed on the first surface 11 of the substrate 100 to be connected to the through electrode TS. A lower wire 116 may be formed on the second surface 12 of the substrate 100 to be connected to the through electrode TS. For example, the upper interconnection line 110 and the lower wire 116 may be formed of at least one of copper, tungsten, silver, gold, or indium. Structural and/or positional features of and/or the relationship between the upper interconnection line 110, the lower wire 116, and the through electrode TS may vary depending on the type of the through electrode, which will be described below.

According to example embodiments of the inventive concept, the through electrode TS may include the metal layer 108 filling a portion of the via hole 171 and the alloy layer 107 provided on the metal layer 108. The alloy layer 107 may be provided within the hole region 172 that is defined by the top surface of the metal layer 108. The metal layer 108 may extend between the alloy layer 107 and the barrier layer 131. On the top surface of the through electrode TS, the alloy layer 107 may be exposed, and further, the metal layer 108, the seed layer 106, the barrier layer 131, and the insulating liner layer 133 provided around the alloy layer 107 may also be exposed. In some embodiments, the alloy layer 107 may be formed to have an upper diameter d1 greater than a thickness d2 of the extended portion of the metal layer 108. In other example embodiments, the alloy layer 107 may be formed to have an upper diameter d1 smaller than a thickness d2 of the extended portion of the metal layer 108.

In certain embodiments, the hole region 172 may be formed to have a sidewall substantially perpendicular to the first surface 11 and/or the second surface 12 of the substrate 100, although it is shown to have a slanted sidewall.

Figure 8A:
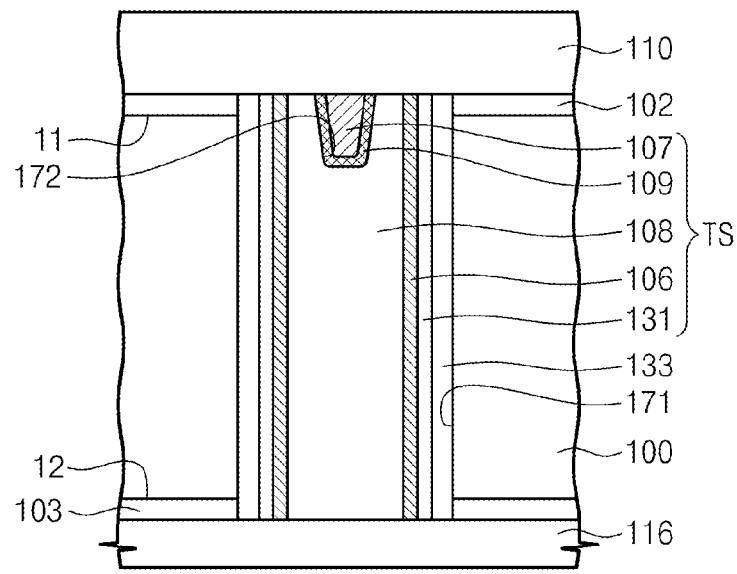
FIGS. 8A and 8B are a cross-sectional view and a plan view illustrating a through electrode according to other example embodiments of the inventive concept.
Figure 8B:
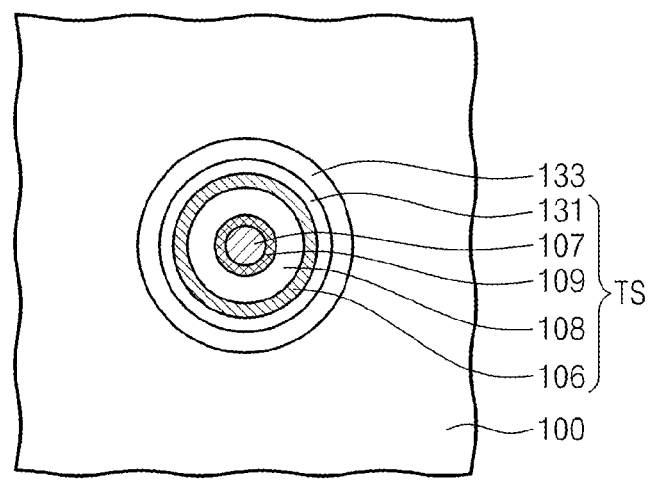

FIGS. 8A and 8B are a cross-sectional view and a plan view illustrating a through electrode according to some other embodiments of the inventive concept. For the sake of simplicity, previously described elements may be identified by similar or identical reference numbers without repeating the description thereof. In the present embodiment, the through electrode TS may further include a conductive separation layer 109 provided between the metal layer 108 and the alloy layer 107. The conductive separation layer 109 may separate the metal layer 108 from the alloy layer 107. The conductive separation layer 109 may be provided, when the metal layer 108 and the alloy layer 107 are formed by different processes. For example, the conductive separation layer 109 may include at least one of a titanium layer, a titanium nitride layer, a tantalum layer, a tantalum nitride layer, a ruthenium layer, a cobalt layer, a manganese layer, a tungsten nitride layer, a nickel layer, a nickel boride layer or a double layer of titanium and titanium nitride. The conductive separation layer 109 may extend between the alloy layer 107 and the metal layer 108, to be exposed on the top surface of the through electrode TS. The conductive separation layer 109 may be provided in structures according to other example embodiments to be described below.

Figure 9A:
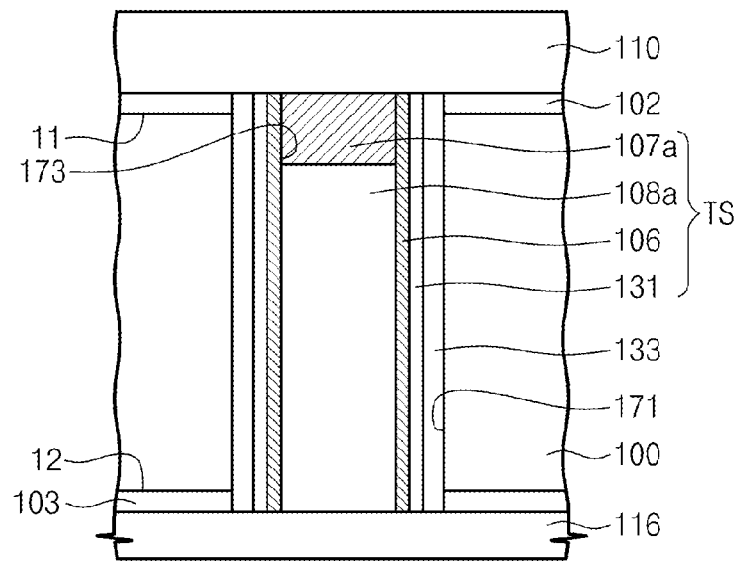
FIGS. 9A through 9C are a cross-sectional view and a plan view illustrating a through electrode according to still other example embodiments of the inventive concept.
Figure 9B:
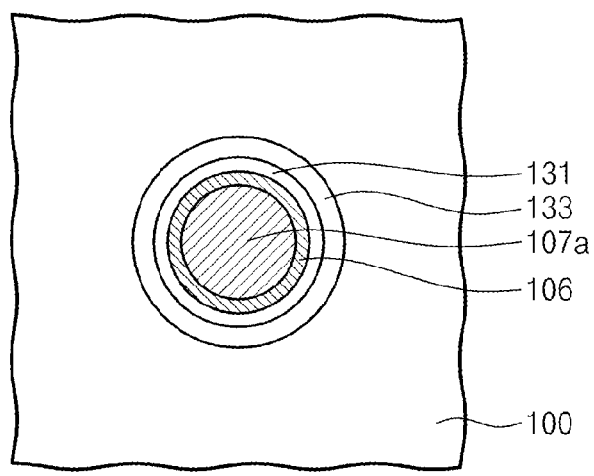
Figure 9C:
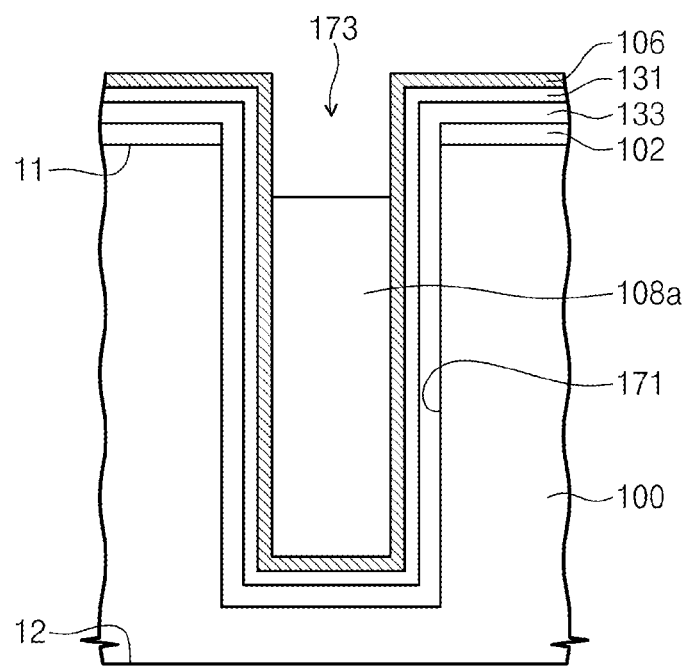

FIGS. 9A through 9C are cross-sectional views and a plan view illustrating a through electrode according to still other example embodiments of the inventive concept. For the sake of simplicity, previously described elements may be identified by similar or identical reference numbers without repeating descriptions thereof. In the present embodiment, a sidewall of an alloy layer 107a may be in contact with an upper sidewall of the seed layer 106, and a metal layer 108a may not be exposed through the top surface of the through electrode TS. For example, the alloy layer 107a may be provided in a hole region 173 formed to expose the upper sidewall of the seed layer 106. In more detail, as shown in FIG. 9C, the metal layer 108a may be formed in a manner that leaves an upper portion (or the upper sidewall) of the seed layer 106 exposed, and the shape of the alloy layer 107a may be determined by the hole region 173 left by the metal layer 108a. In example embodiments, during the electroplating process, a current applied to the seed layer 106 may be interrupted. In this case, a portion of the metal layer formed on the sidewall of the seed layer 106 may be partially dissolved to realize the aforedescribed shape of the metal layer 108a. For example, in the stage of forming an upper portion of the metal layer 108a, the electroplating process may be performed using an increased suppressor in such a way that the plating layer is not formed on the upper sidewall of the seed layer 106.

Figure 10A:
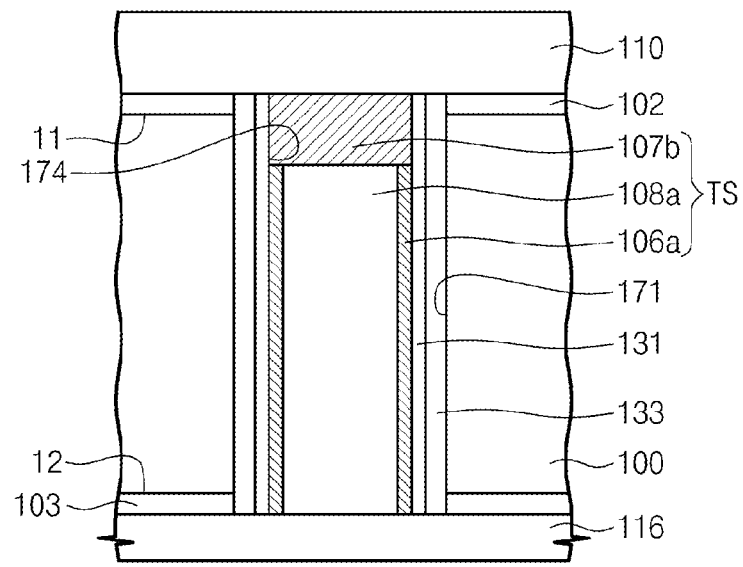
FIGS. 10A through 10D are a cross-sectional view and a plan view illustrating a through electrode according to even other example embodiments of the inventive concept.
Figure 10B:
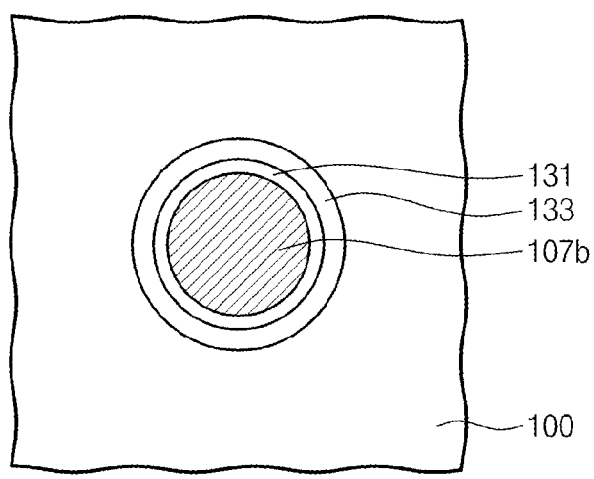
Figure 10C:
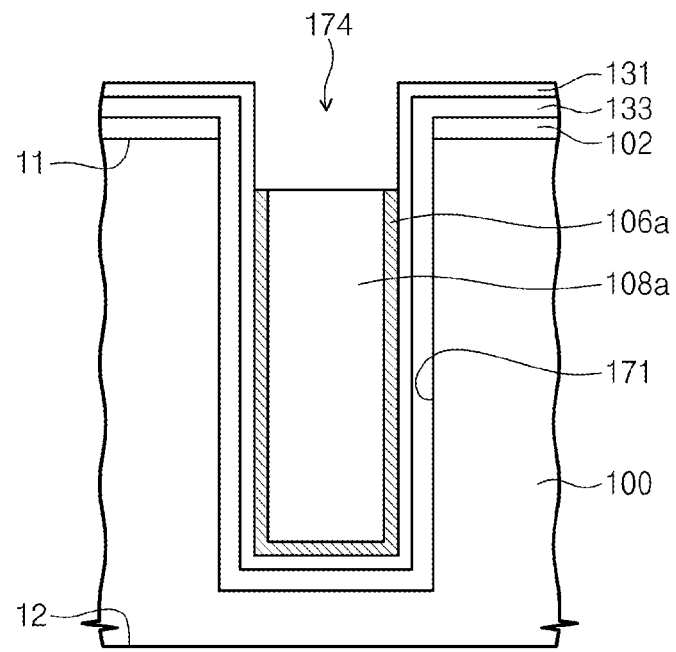

FIGS. 10A through 10D are cross-sectional views and a plan view illustrating a through electrode according to some embodiments of the inventive concept. For the sake of simplicity, the previously described elements may be identified by similar or identical reference numbers without repeating descriptions thereof. In the present embodiment, a sidewall of an alloy layer 107b may be in contact with an upper sidewall of the barrier layer 131, and the metal layer 108a and a seed layer 106a may not be exposed through the top surface of the through electrode TS. In other words, the alloy layer 107b may be provided within a hole region 174 formed to expose the upper sidewall of the barrier layer 131. As shown in FIG. 10C, the metal layer 108a and the seed layer 106a may be formed in a manner that leaves the upper portion (or upper sidewall) of the barrier layer 131 exposed, and the shape of the alloy layer 107a may be determined by the hole region 174 left open by the metal layer 108a and the seed layer 106a. In some embodiments, during the electroplating process, a current applied to the seed layer 106a may be interrupted. In this case, portions of the seed layer 106a and the metal layer 108a formed on the sidewall of the seed layer 106a, may be dissolved to realize the afore-described shapes of the metal layer 108a and the seed layer 106a. Here, the alloy layer 107b on the metal layer 108a may be formed by forming an alloy layer using a CVD or PVD process, not a plating process, and then, performing a thermal reflow process on the resulting structure.

The through electrodes and fabricating methods thereof may be applied to realize semiconductor devices with through electrodes. The through electrode may be classified into one of via last, via middle, and via-first structures. Here, the structures and fabricating methods will be described in detail.

Figure 10D:
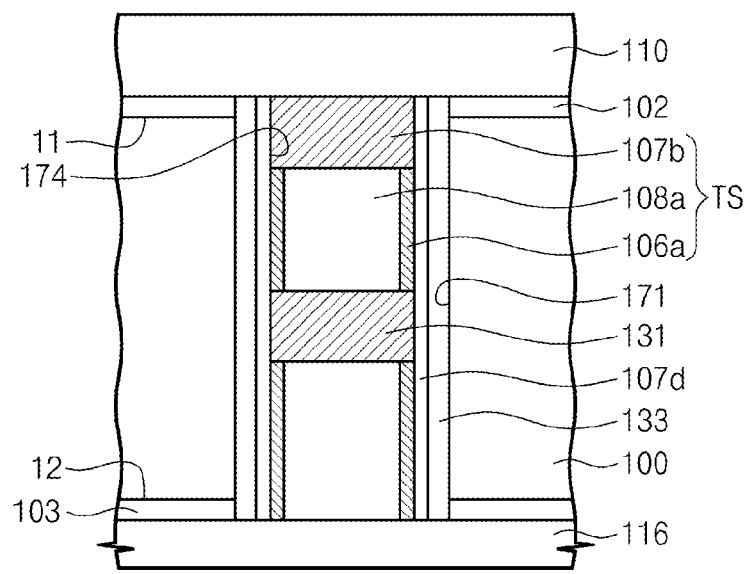

As shown in FIG. 10D, another alloy layer 107d formed of a material similar or identical to the alloy layer 107b may be optionally formed below the alloy layer 107b to increase the effectiveness of the inventive concept.6

[Via Middle]

Figure 11A:
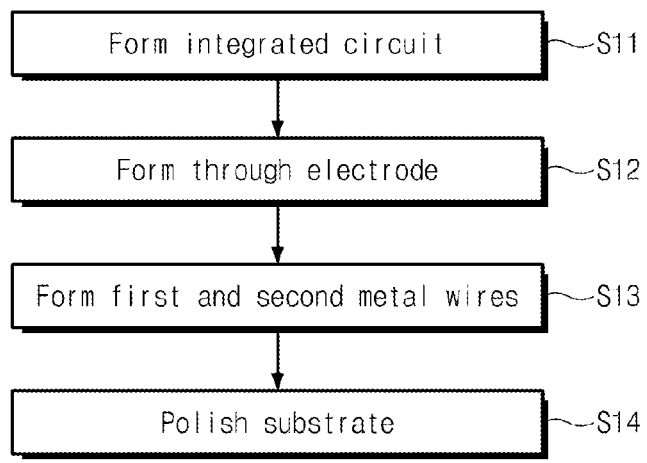
FIG. 11A is a flow chart illustrating a method of fabricating a semiconductor device including a via-middle type through electrode.
Figure 11B:
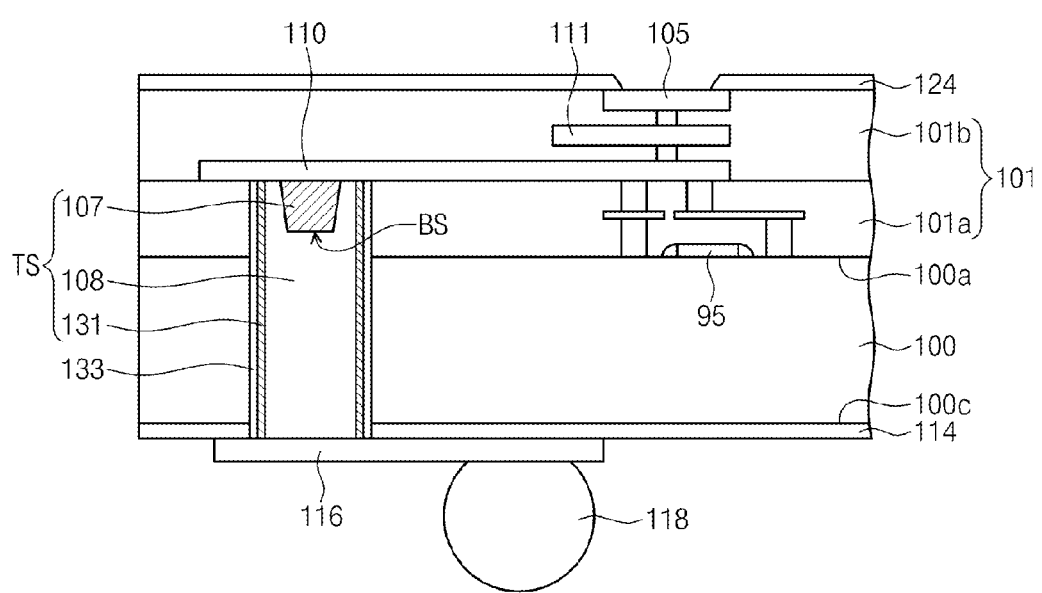
FIG. 11B is a cross-sectional view of a semiconductor device formed by the method of FIG. 11A.

FIG. 11A is a flow chart illustrating a method of fabricating a semiconductor device including a via-middle type through electrode, which may be formed between steps of forming integrated circuits and conductive wires, and FIG. 11B is a cross-sectional view of a semiconductor device formed by the method of FIG. 11A. In order to reduce complexity in the drawings and to provide better understanding of example embodiments of the inventive concept, FIG. 11B shows the through electrode described with reference to FIGS. 7A and 7B, but the method and structure of FIGS. 11A and 11B can be realized by the through electrodes according to other example embodiments. For the sake of brevity, the previously described elements may be identified by similar or identical reference numbers without repeating the description thereof.

Referring to FIG. 11A and FIG. 11B, a through electrode TS may be formed (in S12) after forming an integrated circuit 95 (in S11) and before forming first and second conductive wires (or an upper interconnection line 110 and a conductive wire 111) (in S13). After the formation of the through electrode TS (in S12), a substrate described with reference to FIGS. 7A and 7B may be polished (in S14), and then, the upper interconnection line 110 and the conductive wire 111 may be formed thereon.

An interlayer insulating layer 101 may include a first interlayer insulating layer 101a, which is formed on a top surface 100a of the substrate 100 to cover an integrated circuit 95, and a second interlayer insulating layer 101b formed on the first interlayer insulating layer 101a to cover the upper interconnection line 110 and the conductive wire 111. The upper interconnection line 110 may be provided between the first interlayer insulating layer 101a and the second interlayer insulating layer 101b to connect the through electrode TS electrically to the integrated circuit 95. The conductive wire 111 may be provided on the upper interconnection line 110 to connect the upper interconnection line 110 to a bonding pad 105 provided on the second interlayer insulating layer 101b. The through electrode TS may be formed to penetrate the substrate 100 and the first interlayer insulating layer 101a. An upper protection layer 124 may be formed on a second interlayer insulating layer 101b to expose the bonding pad 105 connected to the conductive wire 111.

In the present embodiment, the through electrode TS may extend from the top surface of the lower wire 116 (or from a region near the bottom surface 100c) toward the top surface of the first interlayer insulating layer 101a and be connected to the upper interconnection line 110. In example embodiments, the bottom surface BS of the alloy layer 107 constituting the through electrode TS may be higher than the top surface 100a of the substrate 100.

In the present application, the substrate 100 and various insulating layers, e.g., interlayer insulating layer 101 on top of the substrate 100 may be referred to as a semiconductor chip.

[Via First]

Figure 12A:
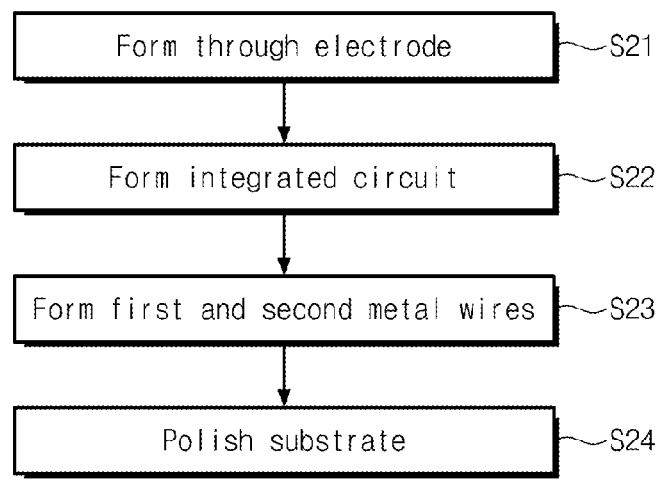
FIG. 12A is a flow chart illustrating a method of fabricating a semiconductor device including a via-first type through electrode.
Figure 12B:
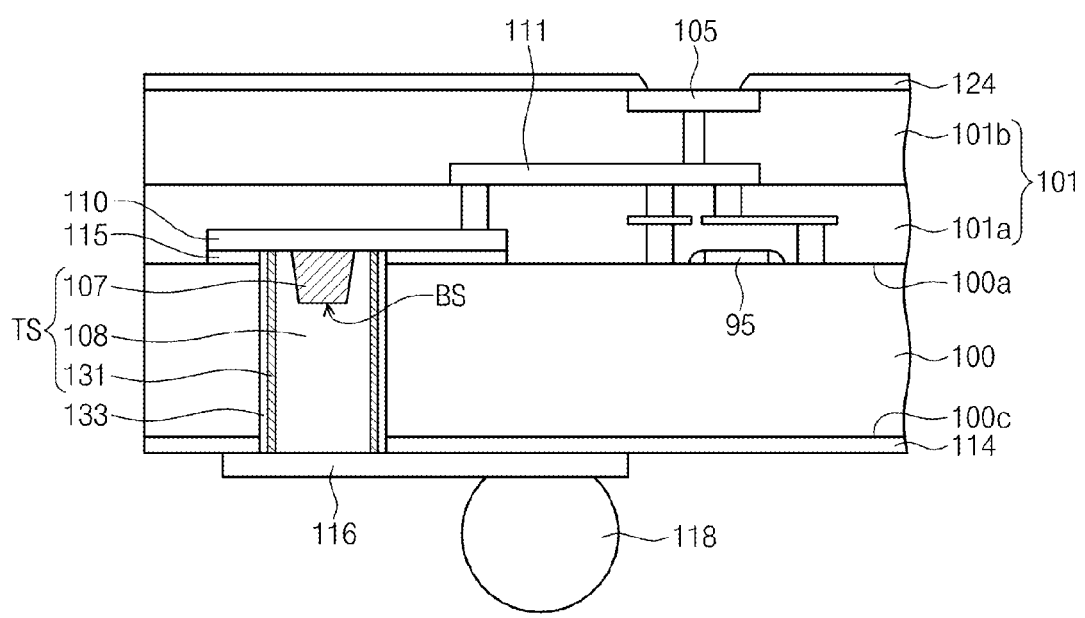
FIG. 12B is a cross-sectional view of a semiconductor device formed by the method of FIG. 12A.

FIG. 12A is a flow chart illustrating a method of fabricating a semiconductor device including a via-first type through electrode, which may be formed before forming integrated circuits and conductive wires, and FIG. 12B is a cross-sectional view of a semiconductor device formed by the method of FIG. 12A. For the sake of brevity, the previously described elements may be identified by similar or identical reference numbers without repeating descriptions thereof.

Referring to FIGS. 12A and 12B, a through electrode TS may be formed (in S21) before forming an integrated circuit 95 (in S22). For example, after the formation of the through electrode TS (in S21), an integrated circuit 95 may be formed (in S22), and then, first and second conductive wires (or an upper interconnection line 110 and a conductive wire 111) may be formed (in S23). Thereafter, a substrate described with reference to FIGS. 7A and 7B may be polished (in S24).

An interlayer insulating layer 101 may be formed on the top surface 100a of the substrate 100. The interlayer insulating layer 101 may include a first interlayer insulating layer 101a covering the integrated circuit 95 and the upper interconnection line 110 and a second interlayer insulating layer 101b covering the conductive wire 111, which is formed on the first interlayer insulating layer 101a, and exposing the bonding pad 105. The upper interconnection line 110 may be referred to as a first conductive wire M1, and the conductive wire 111 may be referred to as a second conductive wire M2.

In the present embodiment, the first interlayer insulating layer 101a may cover the top surface of the through electrode TS. The upper interconnection line 110 may be provided between the first interlayer insulating layer 101a and the through electrode TS. The conductive wire 111 may be provided between the first interlayer insulating layer 101a and the second interlayer insulating layer 101b to connect the upper interconnection line 110 electrically to the integrated circuit 95. The through electrode TS may be connected to the upper interconnection line 110 through an etch-stop layer 115, which may be provided below the upper interconnection line 110.

The bottom surface BS of the alloy layer 107 constituting the through electrode TS may be lower than the top surface 100a of the substrate 100.

In this embodiment, the through electrode TS may not extend to a top surface of the first interlayer insulating layer 101a unlike the embodiment shown in FIG. 11B.

[Via Last]

Figure 13A:
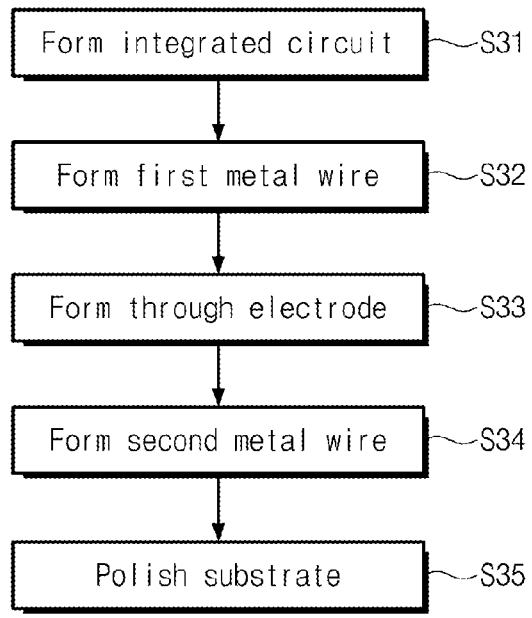
FIG. 13A is a flow chart illustrating a method of fabricating a semiconductor device including a via-last type through electrode.
Figure 13B:
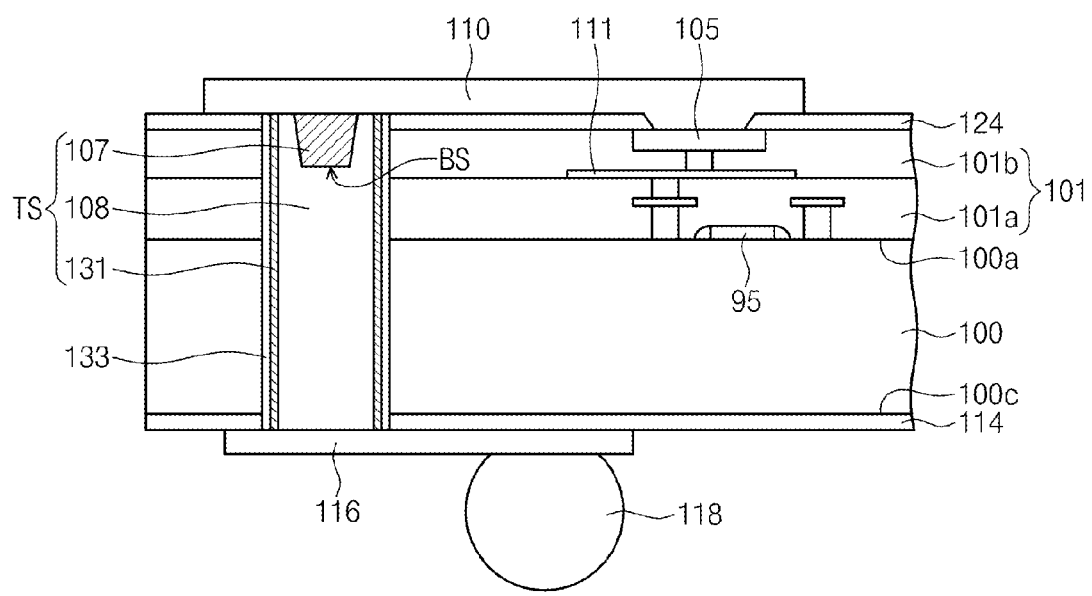
FIG. 13B is a cross-sectional view of a semiconductor device formed by the method of FIG. 13A.

FIG. 13A is a flow chart illustrating a method of fabricating a semiconductor device including a via-last type through electrode, which may be formed after forming integrated circuits and conductive wires, and FIG. 13B is a cross-sectional view of a semiconductor device formed by the method of FIG. 13A. For the sake of simplicity, the previously described elements may be identified by similar or identical reference numbers without repeating descriptions thereof.

Referring to FIGS. 13A and 13B, a through electrode TS may be formed (in S33) after forming an integrated circuit 95 (in S31) and forming a first conductive wire (or a conductive wire 111) (in S32). For example, after the formation of the integrated circuit 95 (in S31), a first interlayer insulating layer 101a may be formed to cover an integrated circuit 95. The conductive wire 111 may be formed to cover the first interlayer insulating layer 101a, and then, a second interlayer insulating layer 101b may be formed to cover the conductive wire 111. The through electrode TS may be formed through the first and second interlayer insulating layers 101a and 101b (in S33), and then, a second conductive wire (or an upper interconnection line 110) may be formed to connect the through electrode TS electrically to the integrated circuit 95 (in S34). In other words, the through electrode TS may be formed after the formation of the first and second interlayer insulating layers 101a and 101b. The conductive wire 111 may be referred to as a first conductive wire M1, while the upper interconnection line 110 may be referred to as a second conductive wire M2. Thereafter, a substrate described with reference to FIGS. 7A and 7B may be polished (in S35).

In the present embodiment, the through electrode TS may extend to the top surface of the second interlayer insulating layer 101b, which is above the first interlayer insulating layer 101a. The bottom surface BS of the alloy layer 107 constituting the through electrode TS may be higher than the top surface of the first interlayer insulating layer 101a.

[Applications]

Figure 14:
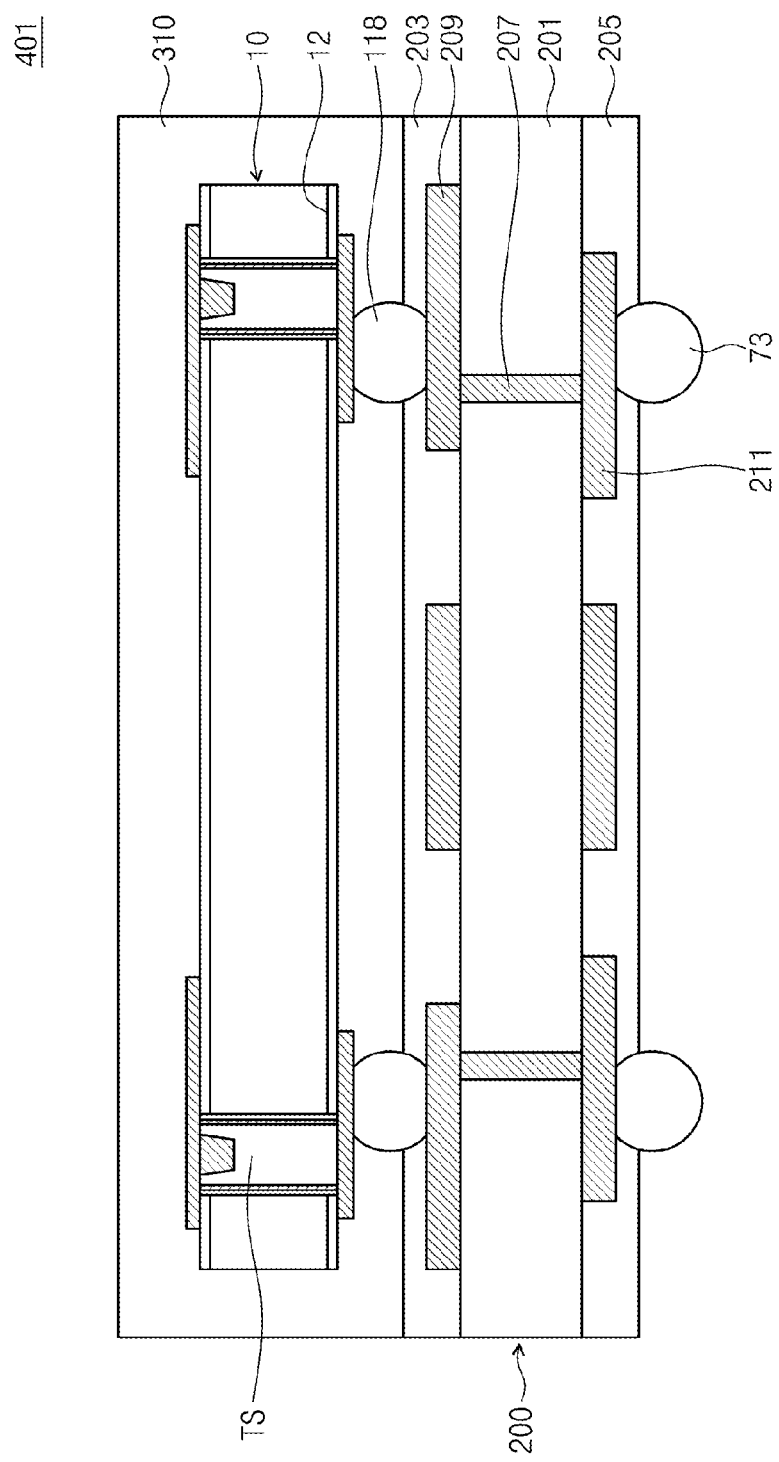
FIGS. 14 through 16 are cross-sectional views of semiconductor packages according to example embodiments of the inventive concept.
Figure 15:
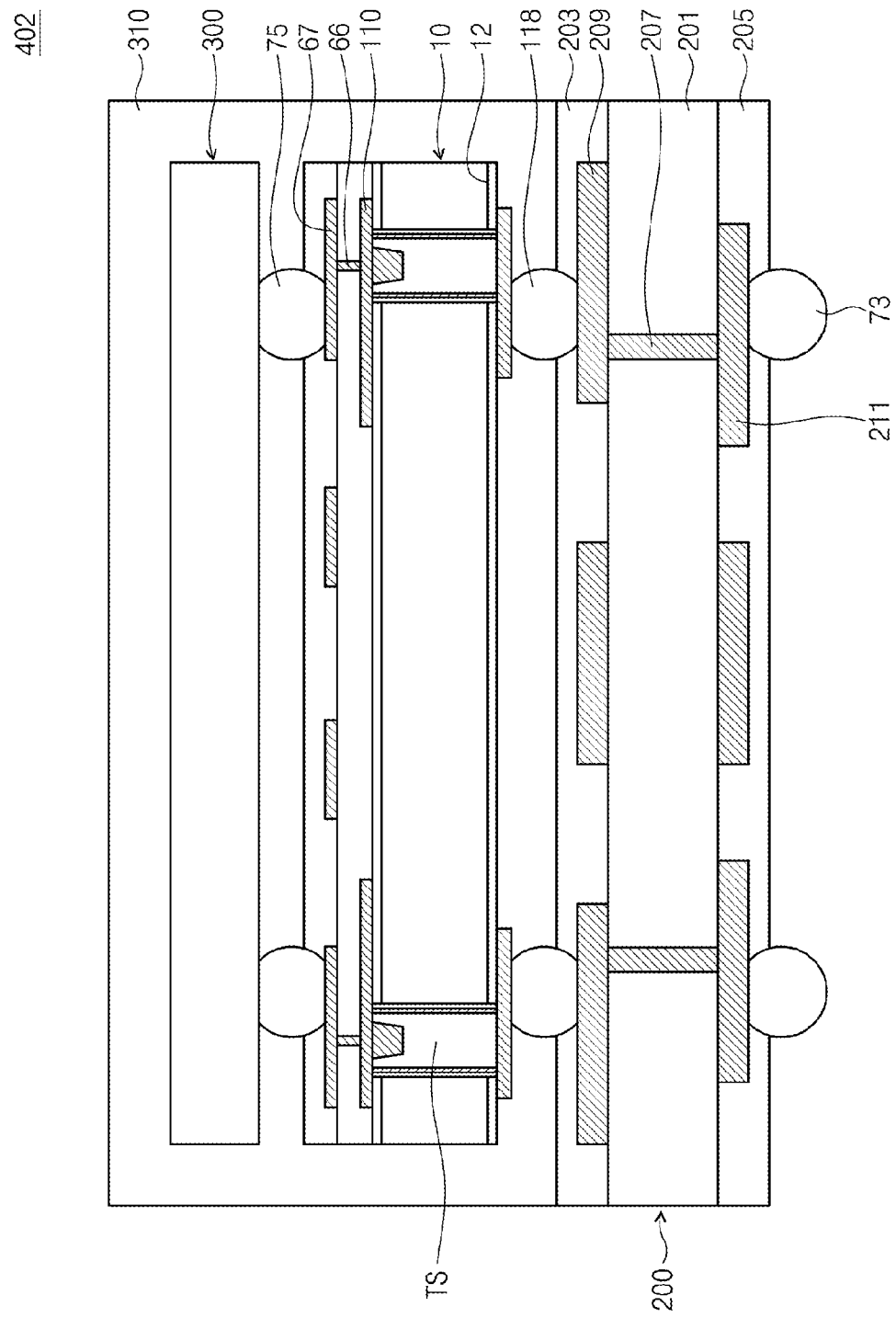
Figure 16:
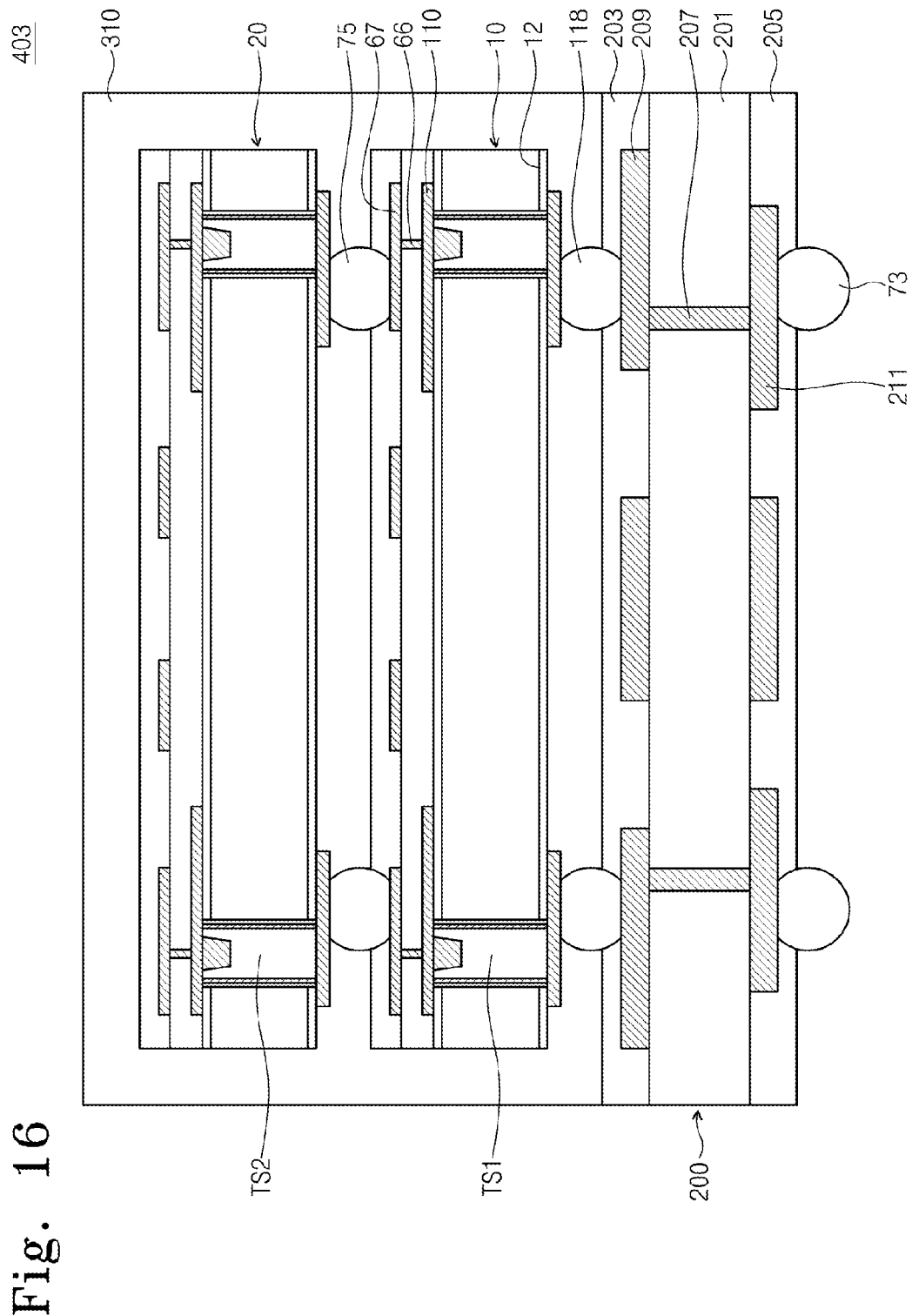

FIGS. 14 through 16 are cross-sectional views of semiconductor packages according to example embodiments of the inventive concept.

Referring to FIG. 14, a semiconductor package 401 may include a package substrate 200 and a semiconductor device 10 mounted thereon. The package substrate 200 may be a printed circuit board. The package substrate 200 may include an insulating substrate 201, a through via 207 penetrating the insulating substrate 201, conductive patterns 209 and 211 provided on top and bottom surfaces of the insulating substrate 201, and package insulating layers 205 and 203 partially covering the conductive patterns 209 and 211. The semiconductor device 10 may be configured to have substantially the same features as those of the semiconductor device described with reference to FIGS. 1 through 13.

The semiconductor device 10 may be mounted on the package substrate 200 such that the second surface 12 of the substrate 100 faces the package substrate 200. In other words, the semiconductor device 10 may be electrically connected to the package substrate 200 by a first bump 118. A second bump 73 may be provided below the package substrate 200. The bumps 118 and 73 may be a solder ball, a conductive bump, a conductive spacer, a pin-grid array, or any combination thereof. The semiconductor package 401 may further include a mold layer 310 covering the semiconductor device 10. The mold layer 310 may include epoxy molding compound.

Referring to FIG. 15, a semiconductor package 402 may include the package substrate 200, the first semiconductor device 10 mounted thereon, and a second semiconductor device 300 provided on the first semiconductor device 10. The package substrate 200 may be a printed circuit board. The package substrate 200 may include the insulating substrate 201, the through via 207 penetrating the insulating substrate 201, the conductive patterns 209 and 211 provided on top and bottom surfaces of the insulating substrate 201, and the package insulating layers 205 and 203 partially covering the conductive patterns 209 and 211 such that portions of the conductive patterns 209 and 211 are exposed for the bump 78 and 118 to be connected to the exposed portions. The first semiconductor device 10 may have substantially the same features as those of the semiconductor device described with reference to FIGS. 1 through 13. The second semiconductor device 300 may be a memory chip, which may be configured to have a different feature from that of the first semiconductor device 10, e.g., a logic chip. The second semiconductor device 300 may be formed with or without the through electrode.

The first semiconductor device 10 may be electrically connected to the package substrate 200 by the first bump 118. The first semiconductor device 10 may include a redistributed structure (or redistribution layer/pattern) electrically connected to the upper interconnection line 110. The redistributed structure may include a contact 66 and a connection pad 67. The second semiconductor device 300 may be mounted on the first semiconductor device 10 in a flip-chip bonding manner. The second semiconductor device 300 may be electrically connected to the connection pad 67 of the first semiconductor device 10 through a third bump 75. For example, the first semiconductor device 10 may serve as an interposer. Each of the numbers of the third bump 75 and the through electrode TS may be two or more.

The second bump 73 may be provided below the package substrate 200. At least one of the bumps 118, 73, and 75 may be a solder ball, a conductive bump, a conductive spacer, a pin-grid array, or any combination thereof. The semiconductor package 402 may further include the mold layer 310 covering the first and second semiconductor devices 10 and 300. The mold layer 310 may include an epoxy molding compound.

Referring to FIG. 16, a semiconductor package 403 may include the package substrate 200, the first semiconductor device 10 mounted thereon, a second semiconductor device 20. In example embodiments, the semiconductor package 403 may be provided to have the multi-chip package structure. The first semiconductor device 10 and the second semiconductor device 20 may be configured to have the same or similar structure as each other.

The package substrate 200 may be a printed circuit board. The package substrate 200 may include the insulating substrate 201, the through via 207 penetrating the insulating substrate 201, the conductive patterns 209 and 211 provided on top and bottom surfaces of the insulating substrate 201, and the package insulating layers 205 and 203 partially covering the conductive patterns 209 and 211. The first and second semiconductor devices 10 and 20 may be configured to have substantially the same features as those of the semiconductor device described with reference to FIGS. 1 through 13.

The first semiconductor device 10 and the second semiconductor device 20 may include a first through electrode TS1 and a second through electrode TS2, respectively. The first through electrode TS1 may be overlapped and connected with the second through electrode TS2. The second through electrode TS2 and the first through electrode TS1 may be connected to each other through the third bump 75.

The first semiconductor device 10 may be electrically connected to the package substrate 200 through the first bump 118. The first semiconductor device 10 may serve as an interposer. The second bump 73 may be provided below the package substrate 200. At least one of the bumps 118, 73, and 75 may be a solder ball, a conductive bump, a conductive spacer, a pin-grid array, or any combination thereof. The semiconductor package 403 may further include the mold layer 310 covering the first and second semiconductor devices 10 and 20. The mold layer 310 may include an epoxy molding compound.

It has been described that the semiconductor package is electrically connected to the package substrate via a through electrode. However, example embodiments of the inventive concept may not be limited thereto. For example, some of the pads may be electrically connected to the package substrate using bonding wires or other suitable interconnects.

Figure 17:
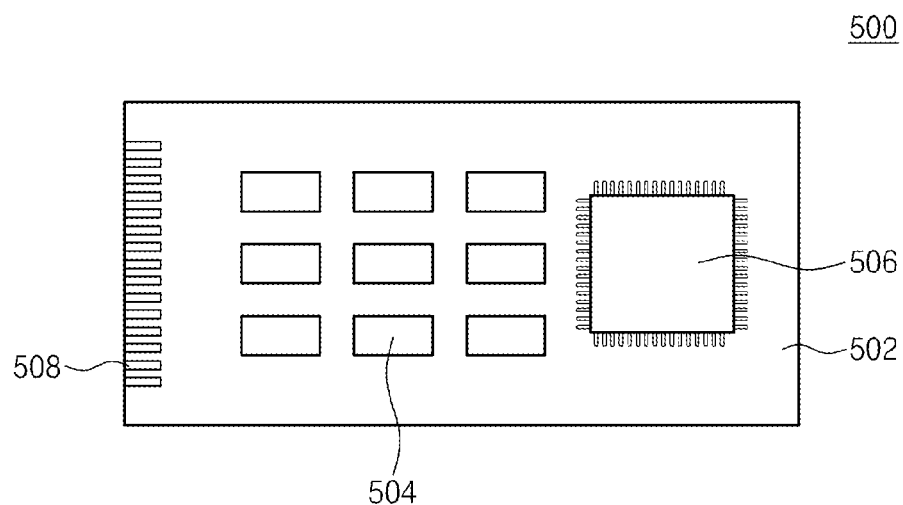
FIG. 17 is a plan view of a package module according to example embodiments of the inventive concept.

FIG. 17 is a plan view illustrating a package module 500 according to example embodiments of the inventive concept. Referring to FIG. 17, the package module 500 may include a module substrate 502 having terminals 508 configured to be connected to an external device, at least one semiconductor chip 504 mounted on the module substrate 502, and a semiconductor package 506 having a quad flat package (QFP) type configuration mounted on the module substrate 502. The semiconductor chip 504 and/or the semiconductor package 506 may include a semiconductor device according to embodiments described above. The package module 500 may be connected to an external electronic device through the terminals 508.

Figure 18:
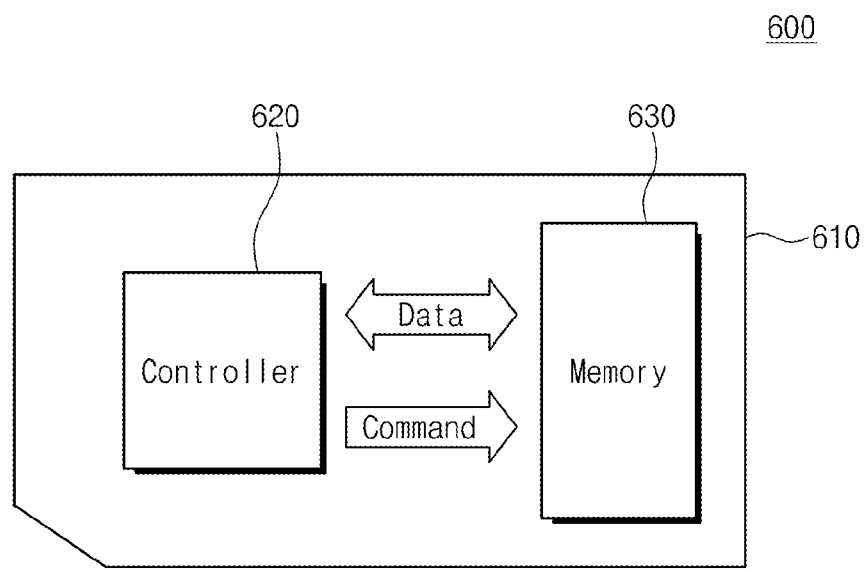
FIG. 18 is a schematic block diagram illustrating an example of memory cards including semiconductor devices and/or packages according to example embodiments of the inventive concept.

FIG. 18 is a schematic block diagram illustrating an example of memory cards including semiconductor devices and/or packages according to example embodiments of the inventive concept. Referring to FIG. 18, the memory card 600 may include a housing 610 as well as a controller 620 and a memory 630 disposed in the housing 610. The controller 620 and the memory 630 may transmit and receive electrical data to and from each other. For example, the controller 620 and the memory 630 may transmit and receive the electrical data to and from each other according to commands from the controller 620. Thus, the memory card 600 may store the memory 630 with the data or may output the data in the memory 630 to an external device.

The controller 620 and/or the memory 630 may include at least one of the semiconductor devices and the semiconductor packages according to the embodiments described herein. The memory card 600 may be used as a data storage media of various portable systems. For example, the memory card 600 may be a multi-media card (MMC) or a secure digital (SD) card.

Figure 19:
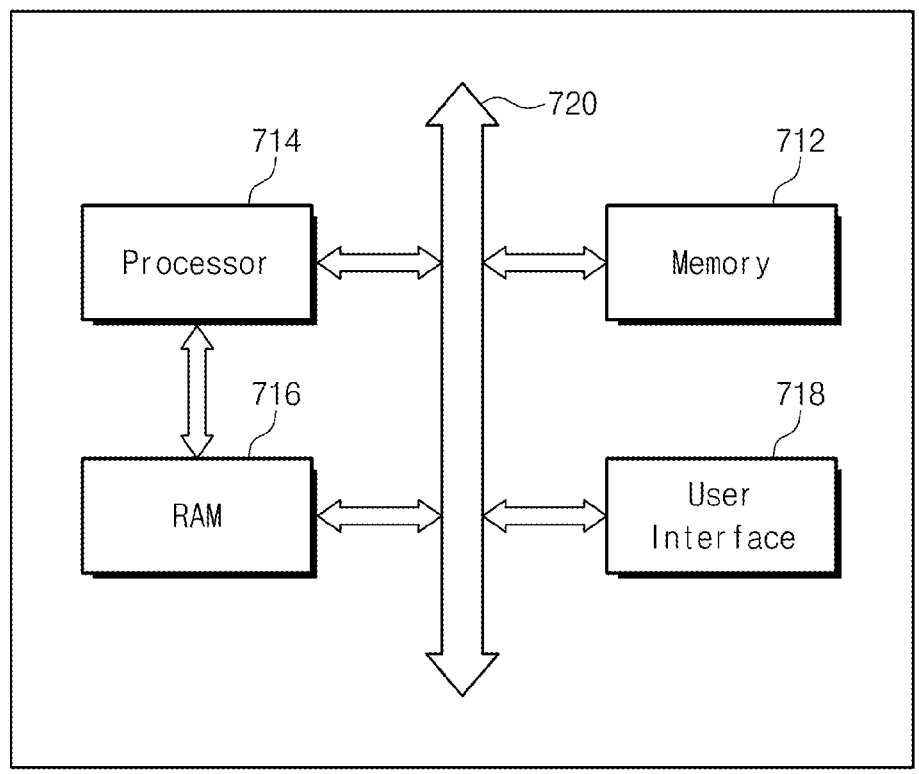
FIG. 19 is a schematic block diagram illustrating an example of electronic systems including semiconductor devices and/or packages according to example embodiments of the inventive concept.

FIG. 19 is a schematic block diagram illustrating an example of electronic systems including semiconductor devices and/or packages according to example embodiments of the inventive concept. Referring to FIG. 19, the electronic system 700 may include at least one of the semiconductor devices and the semiconductor packages according to the embodiments of inventive concept. The electronic system 700 may be a mobile system or a computer in some embodiments. For example, the electronic system 700 may include a memory system 712, a processor 714, a random access memory (RAM) 716 and a user interface 718. The memory system 712, the processor 714, the random access memory (RAM) 716 and the user interface 718 may communicate with each other through a data bus 720. The processor 714 may execute a program and may control the electronic system 700.

The RAM 716 may be used as an operation memory of the processor 714. For example, the processor 714 and the RAM 716 may include one of the semiconductor devices according to example embodiments of the inventive concept and/or one of the semiconductor packages according to example embodiments of the inventive concept. The processor 714 and the RAM 716 may be encapsulated in a single package. The user interface 718 may be used to input data from an external device into the electric system 700 or output the data of the electronic system 700 to the external device. The memory system 712 may store a code to operate the processor 714, data processed by the processor 714 or data received from an external device. The memory system 712 may include a controller and a memory. The memory system 712 may have substantially the same configuration as the memory card 600 illustrated in FIG. 17. The electronic system 700 may also be applied to an electronic control system of the various electronic products.

Figure 20:
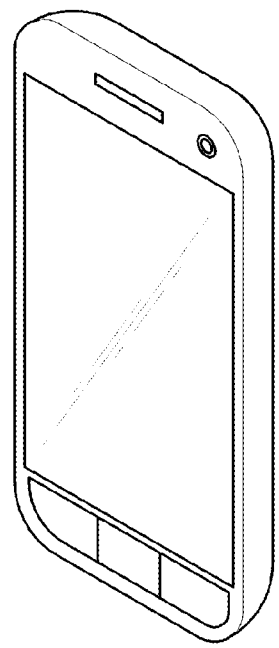
FIG. 20 is a schematic view illustrating a mobile phone to which the electronic system can be applied.

FIG. 20 is a schematic view illustrating a mobile phone 800 to which the electronic system 700 of FIG. 19 can be applied. However, it will be understood that, in other embodiments, the electronic system 700 of FIG. 19 may be applied to portable notebook computers, MP3 players, navigators, solid state disks (SSDs), automobiles, and/or household appliances.

According to example embodiments of the inventive concept, a through-silicon-via (TSV) electrode may include an upper portion consisting of small crystal grains, and this enables to suppress the upper portion of the through electrode from extruding. Furthermore, it is possible to prevent an interlayer insulating layer provided on the through electrode from being deformed or cracked, to prevent the through electrode from being delaminated from an upper interconnection line, and consequently, to obtain improved contact resistance characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a first surface and a second surface opposite to each other; and
a through electrode provided in a via hole, the via hole penetrating the substrate,
wherein the through electrode comprises:
a metal layer filling a portion of the via hole; and
an alloy layer filling another portion of the via hole,
wherein a crystal grain size of the alloy layer is smaller than that of the metal layer,
wherein the alloy layer contains at least two metallic elements, one of which is the same as that contained in the metal layer, and the other one of which is different from that contained in the metal layer,
wherein the through electrode further comprises a conductive separation layer between the metal layer and the alloy layer, and wherein the metal layer is separated from the alloy layer by the conductive separation layer.

2. The device of claim 1, wherein the through electrode includes a top surface adjacent to the first surface and a bottom surface adjacent to the second surface, and the alloy layer provides at least a portion of the top surface of the through electrode.

3. The device of claim 1, wherein the metal layer comprises an extended portion interposed between sidewall of the alloy layer and a sidewall of the via hole.

4. The device of claim 3, wherein a top diameter of the alloy layer is greater than a horizontal thickness of the extended portion.

5. The device of claim 3, further comprising;
an integrated circuit provided adjacent to the through electrode on the first surface; and
an upper interconnection line connecting the through electrode electrically to the integrated circuit,
wherein both the metal layer and the alloy layer are in contact with the upper interconnection line.

6. The device of claim 1, wherein the through electrode further comprises a barrier layer provided along a sidewall of the via hole, and wherein the alloy layer is in contact with the barrier layer.

7. The device of claim 1, wherein a thickness of the alloy layer ranges between about 2-15% of a total vertical length of the through electrode.

8. The device of claim 1, wherein a mean crystal grain size of the metal layer is at least greater than two times of a mean crystal grain size of the alloy layer.

9. The device of claim 1, wherein the alloy layer comprises a copper alloy or a tungsten alloy.

10. The device of claim 1, wherein the metal layer comprises copper (Cu), and the alloy layer comprises at least one of Cu—Mn alloy containing Mn of 5-8 at.%, Cu—Au alloy containing Au of 10 at.% or more, or Cu—Ni alloy containing Ni of 2 at.% or more.

11. The device of claim 1, wherein the metal layer comprises tungsten (W), and the alloy layer comprises at least one of W—Mn alloy containing Mn of 5-8 at.%, W—Au alloy containing Au of 10 at.% or more, or W—Ni alloy containing Ni of 2 at.% or more.

12. The device of claim 1, further comprising:
an integrated circuit provided adjacent to the through electrode on the first surface; and
a first interlayer insulating layer covering the integrated circuit,
wherein the through electrode extends to a top surface of the first interlayer insulating layer.

13. The device of claim 12, wherein the alloy layer has a bottom surface that is higher than the first surface.

14. The device of claim 1, further comprising:
an integrated circuit provided adjacent to the through electrode on the first surface; and
a first interlayer insulating layer covering the integrated circuit,
wherein the first interlayer insulating layer covers a top surface of the through electrode.

15. The device of claim 1, further comprising:
an integrated circuit provided adjacent to the through electrode on the first surface;
a first interlayer insulating layer covering the integrated circuit;
a conductive wire on the first interlayer insulating layer; and
a second interlayer insulating layer on the conductive wire,
wherein the through electrode extends to about a top surface of the second interlayer insulating layer.

16. A semiconductor device, comprising:
a substrate including an active surface and a non-active surface arranged opposite to each other and further including a via hole extending from the active surface to the non-active surface through the substrate;
a barrier layer provided along a sidewall of the via hole; and
a through electrode provided in the via hole,
wherein the through electrode comprises a metal layer filling a portion of the via hole and an alloy layer provided on the metal layer, the alloy layer containing at least one metallic element that is different from that contained in the metal layer, and
wherein the metal layer comprises an extended portion interposed between a sidewall of the alloy layer and the barrier layer,
wherein the through electrode further comprises a conductive separation layer between the metal layer and the alloy layer, and wherein the metal layer is separated from the alloy layer by the conductive separation layer.

17. The device of claim 16, wherein the metal layer further comprises a body portion provided below the alloy layer, and wherein a crystal grain size of the extended portion is smaller than that of the body portion.

18. The device of claim 16, further comprising:
an integrated circuit provided adjacent to the through electrode on an active surface of the substrate; and
an upper interconnection line connecting the through electrode electrically to the integrated circuit,
wherein both the metal layer and the alloy layer are in contact with the upper interconnection line.

19. The device of claim 18, further comprising an interlayer insulating layer covering the integrated circuit,
wherein the through electrode is connected to the upper interconnection line through the interlayer insulating layer.

20. The device of claim 19, wherein the alloy layer has a bottom surface that is higher than the active surface.

21. The device of claim 16, wherein the extended portion has an inner sidewall that is slanted at an angle with respect to the sidewall of the via hole.

22. The device of claim 16, wherein the alloy layer further comprises a metallic element that is the same as that in the metal layer.

23. A device, comprising:
a semiconductor chip including:
a semiconductor substrate;
an interlayer insulating layer overlying the semiconductor substrate,
wherein the semiconductor chip has a through electrode vertically extending through at least a portion of the semiconductor chip, and
wherein the through electrode comprises:
a metal layer; and
an alloy layer formed adjacent to the metal layer, wherein the alloy layer contains at least two metallic elements, one of which is the same as that contained in the metal layer, and another one of which is different from that contained in the metal layer,
wherein a crystal grain size of the alloy layer is smaller than that of the metal layer,
wherein the through electrode further comprises a conductive separation layer between the metal layer and the alloy layer, and wherein the metal layer is separated from the alloy layer by the conductive separation layer.

24. The device of claim 23, wherein the interlayer insulating layer comprises a first interlayer insulating layer and a second interlayer insulating layer, which are sequentially stacked, and wherein the through electrode penetrates the substrate and the first interlayer insulating layer.

25. The device of claim 24, wherein the through electrode does not penetrate the second interlayer insulating layer.

26. The device of claim 23, wherein the interlayer insulating layer comprises a first interlayer insulating layer and a second interlayer insulating layer, which are sequentially stacked, and wherein the through electrode penetrates the semiconductor substrate.

27. The device of claim 26, wherein the through electrode does not penetrate the first and second interlayer insulating layer.

28. The device of claim 23, wherein the interlayer insulating layer comprises a first interlayer insulating layer and a second interlayer insulating layer, which are sequentially stacked, and wherein the through electrode penetrates the substrate and the first and second interlayer insulating layers.

* * * * *